(12) United States Patent
Singh et al.

(10) Patent No.: US 11,868,629 B1
(45) Date of Patent: Jan. 9, 2024

(54) STORAGE SYSTEM SIZING SERVICE

(71) Applicant: Pure Storage, Inc., Mountain View, CA (US)

(72) Inventors: Manpreet Singh, Palo Alto, CA (US); Li Zhao, Daly City, CA (US); Chengxiang Ren, Sunnyvale, CA (US); Taras Glek, Redwood City, CA (US)

(73) Assignee: PURE STORAGE, INC.

( * ) Notice: Subject to any disclaimer, the term of this patent is extended or adjusted under 35 U.S.C. 154(b) by 105 days.

(21) Appl. No.: 15/967,507

(22) Filed: Apr. 30, 2018

Related U.S. Application Data

(60) Provisional application No. 62/502,246, filed on May 5, 2017.

(51) Int. Cl.
*G06F 3/00* (2006.01)
*G06F 3/06* (2006.01)
*G06F 11/30* (2006.01)
*G06F 11/34* (2006.01)
*G06F 30/20* (2020.01)

(52) U.S. Cl.
CPC .......... *G06F 3/0632* (2013.01); *G06F 3/0604* (2013.01); *G06F 3/067* (2013.01); *G06F 3/0653* (2013.01); *G06F 11/3006* (2013.01); *G06F 11/3034* (2013.01); *G06F 11/3442* (2013.01); *G06F 11/3447* (2013.01); *G06F 30/20* (2020.01)

(58) Field of Classification Search
CPC ........ G06F 3/0632; G06F 3/20; G06F 3/0604; G06F 3/0653; G06F 3/067; G06F 11/3006; G06F 11/3034; G06F 11/3442; G06F 11/3447
See application file for complete search history.

(56) References Cited

U.S. PATENT DOCUMENTS

| 5,706,210 A | 1/1998 | Kumano et al. |
| 5,799,200 A | 8/1998 | Brant et al. |

(Continued)

FOREIGN PATENT DOCUMENTS

| EP | 0725324 A2 | 8/1996 |
| WO | WO-2012/087648 A1 | 6/2012 |

(Continued)

OTHER PUBLICATIONS

Paul Sweere, *Creating Storage Class Persistent Memory with NVDIMM*, Published in Aug. 2013, Flash Memory Summit 2013, <http://ww.flashmemorysummit.com/English/Collaterals/Proceedings/2013/20130814_T2_Sweere.pdf>, 22 pages.

(Continued)

*Primary Examiner* — Craig S Goldschmidt

(57) ABSTRACT

A storage system sizing service that includes: translating one or more specifications characterizing user requirements into workload parameters; generating a plurality of performance model results by providing the workload parameters as respective inputs to respective performance models, wherein the respective performance models correspond to respective distinct configurations of a plurality of storage systems; and selecting, in dependence upon the performance model results, one or more distinctly configured storage system configurations from among the plurality of storage systems.

20 Claims, 18 Drawing Sheets

(56) References Cited

U.S. PATENT DOCUMENTS

| | | | |
|---|---|---|---|
| 5,933,598 A | 8/1999 | Scales et al. | |
| 6,012,032 A | 1/2000 | Donovan et al. | |
| 6,067,412 A * | 5/2000 | Blake | G06F 11/3409 |
| | | | 714/E11.192 |
| 6,085,333 A | 7/2000 | DeKoning et al. | |
| 6,643,641 B1 | 11/2003 | Snyder | |
| 6,647,514 B1 | 11/2003 | Umberger et al. | |
| 6,789,162 B1 | 9/2004 | Talagala et al. | |
| 7,089,272 B1 | 8/2006 | Garthwaite et al. | |
| 7,107,389 B2 | 9/2006 | Inagaki et al. | |
| 7,146,521 B1 | 12/2006 | Nguyen | |
| 7,334,124 B2 | 2/2008 | Pham et al. | |
| 7,437,530 B1 | 10/2008 | Rajan | |
| 7,447,729 B1 * | 11/2008 | Thakur | G06Q 10/04 |
| | | | 709/200 |
| 7,493,424 B1 | 2/2009 | Bali et al. | |
| 7,669,029 B1 | 2/2010 | Mishra et al. | |
| 7,689,609 B2 | 3/2010 | Lango et al. | |
| 7,743,191 B1 | 6/2010 | Liao | |
| 7,899,780 B1 | 3/2011 | Shmuylovich et al. | |
| 8,042,163 B1 | 10/2011 | Karr et al. | |
| 8,086,585 B1 | 12/2011 | Brashers et al. | |
| 8,200,887 B2 | 6/2012 | Bennett | |
| 8,271,700 B1 | 9/2012 | Annem et al. | |
| 8,387,136 B2 | 2/2013 | Lee et al. | |
| 8,437,189 B1 | 5/2013 | Montierth et al. | |
| 8,465,332 B2 | 6/2013 | Hogan et al. | |
| 8,527,544 B1 | 9/2013 | Colgrove et al. | |
| 8,566,546 B1 | 10/2013 | Marshak et al. | |
| 8,578,442 B1 | 11/2013 | Banerjee | |
| 8,613,066 B1 | 12/2013 | Brezinski et al. | |
| 8,620,970 B2 | 12/2013 | English et al. | |
| 8,751,463 B1 | 6/2014 | Chamness | |
| 8,762,642 B2 | 6/2014 | Bates et al. | |
| 8,769,622 B2 | 7/2014 | Chang et al. | |
| 8,800,009 B1 | 8/2014 | Beda, III et al. | |
| 8,812,860 B1 | 8/2014 | Bray | |
| 8,850,546 B1 | 9/2014 | Field et al. | |
| 8,898,346 B1 | 11/2014 | Simmons | |
| 8,909,854 B2 | 12/2014 | Yamagishi et al. | |
| 8,931,041 B1 | 1/2015 | Banerjee | |
| 8,949,863 B1 | 2/2015 | Coatney et al. | |
| 8,984,602 B1 | 3/2015 | Bailey et al. | |
| 8,990,905 B1 | 3/2015 | Bailey et al. | |
| 9,081,713 B1 | 7/2015 | Bennett | |
| 9,124,569 B2 | 9/2015 | Hussain et al. | |
| 9,134,922 B2 | 9/2015 | Rajagopal et al. | |
| 9,189,334 B2 | 11/2015 | Bennett | |
| 9,209,973 B2 | 12/2015 | Aikas et al. | |
| 9,250,823 B1 | 2/2016 | Kamat et al. | |
| 9,300,660 B1 | 3/2016 | Borowiec et al. | |
| 9,311,182 B2 | 4/2016 | Bennett | |
| 9,444,822 B1 | 9/2016 | Borowiec et al. | |
| 9,507,532 B1 | 11/2016 | Colgrove et al. | |
| 9,632,870 B2 | 4/2017 | Bennett | |
| 10,108,517 B1 * | 10/2018 | Efremov | G06F 11/3485 |
| 10,152,357 B1 * | 12/2018 | Espy | G06F 11/3051 |
| 2002/0013802 A1 | 1/2002 | Mori et al. | |
| 2003/0145172 A1 | 7/2003 | Galbraith et al. | |
| 2003/0191783 A1 | 10/2003 | Wolczko et al. | |
| 2003/0225961 A1 | 12/2003 | Chow et al. | |
| 2004/0080985 A1 | 4/2004 | Chang et al. | |
| 2004/0111573 A1 | 6/2004 | Garthwaite | |
| 2004/0153844 A1 | 8/2004 | Ghose et al. | |
| 2004/0193814 A1 | 9/2004 | Erickson et al. | |
| 2004/0260967 A1 | 12/2004 | Guha et al. | |
| 2005/0160416 A1 | 7/2005 | Jamison | |
| 2005/0188246 A1 | 8/2005 | Emberty et al. | |
| 2005/0216800 A1 | 9/2005 | Bicknell et al. | |
| 2006/0015771 A1 | 1/2006 | Van Gundy et al. | |
| 2006/0129817 A1 | 6/2006 | Borneman et al. | |
| 2006/0161726 A1 | 7/2006 | Lasser | |
| 2006/0230245 A1 | 10/2006 | Gounares et al. | |
| 2006/0239075 A1 | 10/2006 | Williams et al. | |
| 2007/0022227 A1 | 1/2007 | Miki | |
| 2007/0028068 A1 | 2/2007 | Golding et al. | |
| 2007/0055702 A1 | 3/2007 | Fridella et al. | |
| 2007/0109856 A1 | 5/2007 | Pellicone et al. | |
| 2007/0150689 A1 | 6/2007 | Pandit et al. | |
| 2007/0168321 A1 | 7/2007 | Saito et al. | |
| 2007/0220227 A1 | 9/2007 | Long | |
| 2007/0294563 A1 | 12/2007 | Bose | |
| 2007/0294564 A1 | 12/2007 | Reddin et al. | |
| 2008/0005587 A1 | 1/2008 | Ahlquist | |
| 2008/0077825 A1 | 3/2008 | Bello et al. | |
| 2008/0162674 A1 | 7/2008 | Dahiya | |
| 2008/0195833 A1 | 8/2008 | Park | |
| 2008/0270678 A1 | 10/2008 | Cornwell et al. | |
| 2008/0282045 A1 | 11/2008 | Biswas et al. | |
| 2009/0077340 A1 | 3/2009 | Johnson et al. | |
| 2009/0100115 A1 | 4/2009 | Park et al. | |
| 2009/0144746 A1 * | 6/2009 | Song | G06F 9/505 |
| | | | 718/105 |
| 2009/0198889 A1 | 8/2009 | Ito et al. | |
| 2010/0052625 A1 | 3/2010 | Cagno et al. | |
| 2010/0211723 A1 | 8/2010 | Mukaida | |
| 2010/0246266 A1 | 9/2010 | Park et al. | |
| 2010/0257142 A1 | 10/2010 | Murphy et al. | |
| 2010/0262764 A1 | 10/2010 | Liu et al. | |
| 2010/0325345 A1 | 12/2010 | Ohno et al. | |
| 2010/0332754 A1 | 12/2010 | Lai et al. | |
| 2011/0072290 A1 | 3/2011 | Davis et al. | |
| 2011/0125894 A1 * | 5/2011 | Anderson | H04L 9/3213 |
| | | | 709/224 |
| 2011/0125955 A1 | 5/2011 | Chen | |
| 2011/0131231 A1 | 6/2011 | Haas et al. | |
| 2011/0167221 A1 | 7/2011 | Pangal et al. | |
| 2012/0023144 A1 | 1/2012 | Rub | |
| 2012/0054264 A1 | 3/2012 | Haugh et al. | |
| 2012/0079318 A1 | 3/2012 | Colgrove et al. | |
| 2012/0131253 A1 | 5/2012 | McKnight et al. | |
| 2012/0204186 A1 * | 8/2012 | Davidson, II | G06F 9/4881 |
| | | | 718/104 |
| 2012/0303919 A1 | 11/2012 | Hu et al. | |
| 2012/0311000 A1 | 12/2012 | Post et al. | |
| 2013/0007845 A1 | 1/2013 | Chang et al. | |
| 2013/0031414 A1 | 1/2013 | Dhuse et al. | |
| 2013/0036272 A1 | 2/2013 | Nelson | |
| 2013/0071087 A1 | 3/2013 | Motiwala et al. | |
| 2013/0145447 A1 | 6/2013 | Maron | |
| 2013/0191555 A1 | 7/2013 | Liu | |
| 2013/0198459 A1 | 8/2013 | Joshi et al. | |
| 2013/0205173 A1 | 8/2013 | Yoneda | |
| 2013/0219164 A1 | 8/2013 | Hamid | |
| 2013/0227201 A1 | 8/2013 | Talagala et al. | |
| 2013/0290607 A1 | 10/2013 | Chang et al. | |
| 2013/0311434 A1 | 11/2013 | Jones | |
| 2013/0318297 A1 | 11/2013 | Jibbe et al. | |
| 2013/0332614 A1 | 12/2013 | Brunk et al. | |
| 2014/0020083 A1 | 1/2014 | Fetik | |
| 2014/0074850 A1 | 3/2014 | Noel et al. | |
| 2014/0082715 A1 | 3/2014 | Grajek et al. | |
| 2014/0086146 A1 | 3/2014 | Kim et al. | |
| 2014/0090009 A1 | 3/2014 | Li et al. | |
| 2014/0096220 A1 | 4/2014 | Da Cruz Pinto et al. | |
| 2014/0101434 A1 | 4/2014 | Senthurpandi et al. | |
| 2014/0164774 A1 | 6/2014 | Nord et al. | |
| 2014/0173232 A1 | 6/2014 | Reohr et al. | |
| 2014/0195636 A1 | 7/2014 | Karve et al. | |
| 2014/0201512 A1 | 7/2014 | Seethaler et al. | |
| 2014/0201541 A1 | 7/2014 | Paul et al. | |
| 2014/0208155 A1 | 7/2014 | Pan | |
| 2014/0215590 A1 | 7/2014 | Brand | |
| 2014/0229654 A1 | 8/2014 | Goss et al. | |
| 2014/0230017 A1 | 8/2014 | Saib | |
| 2014/0258526 A1 | 9/2014 | Le Sant et al. | |
| 2014/0282983 A1 | 9/2014 | Ju et al. | |
| 2014/0285917 A1 | 9/2014 | Cudak et al. | |
| 2014/0325262 A1 | 10/2014 | Cooper et al. | |
| 2014/0351627 A1 | 11/2014 | Best et al. | |
| 2014/0373104 A1 | 12/2014 | Gaddam et al. | |
| 2014/0373126 A1 | 12/2014 | Hussain et al. | |
| 2015/0026387 A1 | 1/2015 | Sheredy et al. | |
| 2015/0074463 A1 | 3/2015 | Jacoby et al. | |

(56) References Cited

U.S. PATENT DOCUMENTS

| | | | |
|---|---|---|---|
| 2015/0089569 A1 | 3/2015 | Sondhi et al. | |
| 2015/0095515 A1 | 4/2015 | Krithivas et al. | |
| 2015/0113203 A1 | 4/2015 | Dancho et al. | |
| 2015/0121137 A1 | 4/2015 | McKnight et al. | |
| 2015/0134920 A1 | 5/2015 | Anderson et al. | |
| 2015/0149822 A1 | 5/2015 | Coronado et al. | |
| 2015/0193169 A1 | 7/2015 | Sundaram et al. | |
| 2015/0324135 A1* | 11/2015 | Chan | G06F 3/061 711/114 |
| 2015/0378888 A1 | 12/2015 | Zhang et al. | |
| 2016/0098323 A1 | 4/2016 | Mutha et al. | |
| 2016/0350009 A1 | 12/2016 | Cerreta et al. | |
| 2016/0352720 A1 | 12/2016 | Hu et al. | |
| 2016/0352830 A1 | 12/2016 | Borowiec et al. | |
| 2016/0352834 A1 | 12/2016 | Borowiec et al. | |
| 2017/0078165 A1* | 3/2017 | Hildebrand | G06F 11/30 |
| 2017/0359272 A1* | 12/2017 | Srinivasan | H04L 47/808 |
| 2018/0232308 A1* | 8/2018 | Kusters | G06F 11/2058 |

FOREIGN PATENT DOCUMENTS

| | | |
|---|---|---|
| WO | WO-2013071087 A1 | 5/2013 |
| WO | WO-2014/110137 A1 | 7/2014 |
| WO | WO-2016/015008 A1 | 12/2016 |
| WO | WO-2016/190938 A1 | 12/2016 |
| WO | WO-2016/195759 A1 | 12/2016 |
| WO | WO-2016/195958 A1 | 12/2016 |
| WO | WO-2016/195961 A1 | 12/2016 |

OTHER PUBLICATIONS

PCMAG, *Storage Array Definition*, Published May 10, 2013. <http://web.archive.org/web/20130510121646/http://www.pcmag.com/encyclopedia/term/52091/storage-array>, 2 pages.

Google Search of "storage array define" performed by the Examiner on Nov. 4, 2015 for U.S. Appl. No. 14/725,278, Results limited to entries dated before 2012, 1 page.

Techopedia, *What is a disk array*, techopedia.com (online), Jan. 13, 2012, 1 page, URL: web.archive.org/web/20120113053358/http://www.techopedia.com/definition/1009/disk-array.

Webopedia, *What is a disk array*, webopedia.com (online), May 26, 2011, 2 pages, URL: web/archive.org/web/20110526081214/http://www.webopedia.com/TERM/D/disk_array.html.

Li et al., *Access Control for the Services Oriented Architecture*, Proceedings of the 2007 ACM Workshop on Secure Web Services (SWS '07), Nov. 2007, pp. 9-17, ACM New York, NY.

Hota et al., *Capability-based Cryptographic Data Access Control in Cloud Computing*, International Journal of Advanced Networking and Applications, col. 1, Issue 1, Aug. 2011, 10 pages, Eswar Publications, India.

Faith, *dictzip file format*, GitHub.com (online), accessed Jul. 28, 2015, 1 page, URL: github.com/fidlej/idzip.

Wikipedia, *Convergent Encryption*, Wikipedia.org (online), accessed Sep. 8, 2015, 2 pages, URL: en.wikipedia.org/wiki/Convergent_encryption.

Storer et al., *Secure Data Deduplication*, Proceedings of the 4th ACM International Workshop on Storage Security and Survivability (StorageSS'08), Oct. 2008, 10 pages, ACM New York, NY, USA, DOI: 10.1145/1456469.1456471.

ETSI, *Network Function Virtualisation (NFV); Resiliency Requirements*, ETSI GS NFCV-REL 001, V1.1.1, Jan. 2015, 82 pages, etsi.org (online), URL: www.etsi.org/deliver/etsi_gs/NFV-REL/001_099/001/01.01.01_60/gs_NFV-REL001v010101p.pdf.

Microsoft, *Hybrid for SharePoint Server 2013—Security Reference Architecture*, Microsoft (online), Oct. 2014, 53 pages, URL: hybrid.office.com/img/Security_Reference_Architecture.pdf.

Microsoft, *Hybrid Identity*, Microsoft (online), Apr. 2014, 36 pages, URL: www.aka.ms/HybridIdentityWp.

Microsoft, *Hybrid Identity Management*, Microsoft (online), Apr. 2014, 2 pages, URL: download.microsoft.com/download/E/A/E/EAE57CD1-A80B-423C-96BB-142FAAC630B9/Hybrid_Identity_Datasheet.pdf.

Bellamy-McIntyre et al., *OpenID and the Enterprise: A Model-based Analysis of Single Sign-On Authentication*, 15th IEEE International Enterprise Distributed Object Computing Conference (EDOC), Aug. 29, 2011, pp. 129-138, IEEE Computer Society, USA, DOI: 10.1109/EDOC.2011.26, ISBN: 978-1-4577-0362-1.

Kong, *Using PCI Express as the Primary System Interconnect in Multiroot Compute, Storage, Communications and Embedded Systems*, White Paper, IDT.com (online), Aug. 28, 2008, 12 pages, URL: www.idt.com/document/whp/idt pcie-multi-root-white-paper.

Hu et al., *Container Marking: Combining Data Placement, Garbage Collection and Wear Levelling for Flash*, 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/US2016/015006, dated Jul. 18, 2016, 12 pages.

International Search Report and Written Opinion, PCT/US2016/015008, dated May 4, 2016, 12 pages.

International Search Report and Written Opinion, PCT/US2016/020410, dated Jul. 8, 2016, 12 pages.

International Search Report and Written Opinion, PCT/US2016/032084, dated Jul. 18, 2016, 12 pages.

International Search Report and Written Opinion, PCT/US2016/016333, dated Jun. 8, 2016, 12 pages.

International Search Report and Written Opinion, PCT/US2016/032052, dated Aug. 30, 2016, 17 pages.

International Search Report and Written Opinion, PCT/US2016/035492, dated Aug. 17, 2016, 10 pages.

International Search Report and Written Opinion, PCT/US2016/036693, dated Aug. 29, 2016, 10 pages.

International Search Report and Written Opinion, PCT/US2016/038758, dated Oct. 7, 2016, 10 pages.

International Search Report and Written Opinion, PCT/US2016/040393, dated Sep. 22, 2016, 10 pages.

International Search Report and Written Opinion, PCT/US2016/044020, dated Sep. 30, 2016, 11 pages.

International Search Report and Written Opinion, PCT/US2016/044874, dated Oct. 7, 2016, 11 pages.

International Search Report and Written Opinion, PCT/US2016/044875, dated Oct. 5, 2016, 13 pages.

International Search Report and Written Opinion, PCT/US2016/044876, dated Oct. 21, 2016, 12 pages.

International Search Report and Written Opinion, PCT/US2016/044877, dated Sep. 29, 2016, 13 pages.

\* cited by examiner

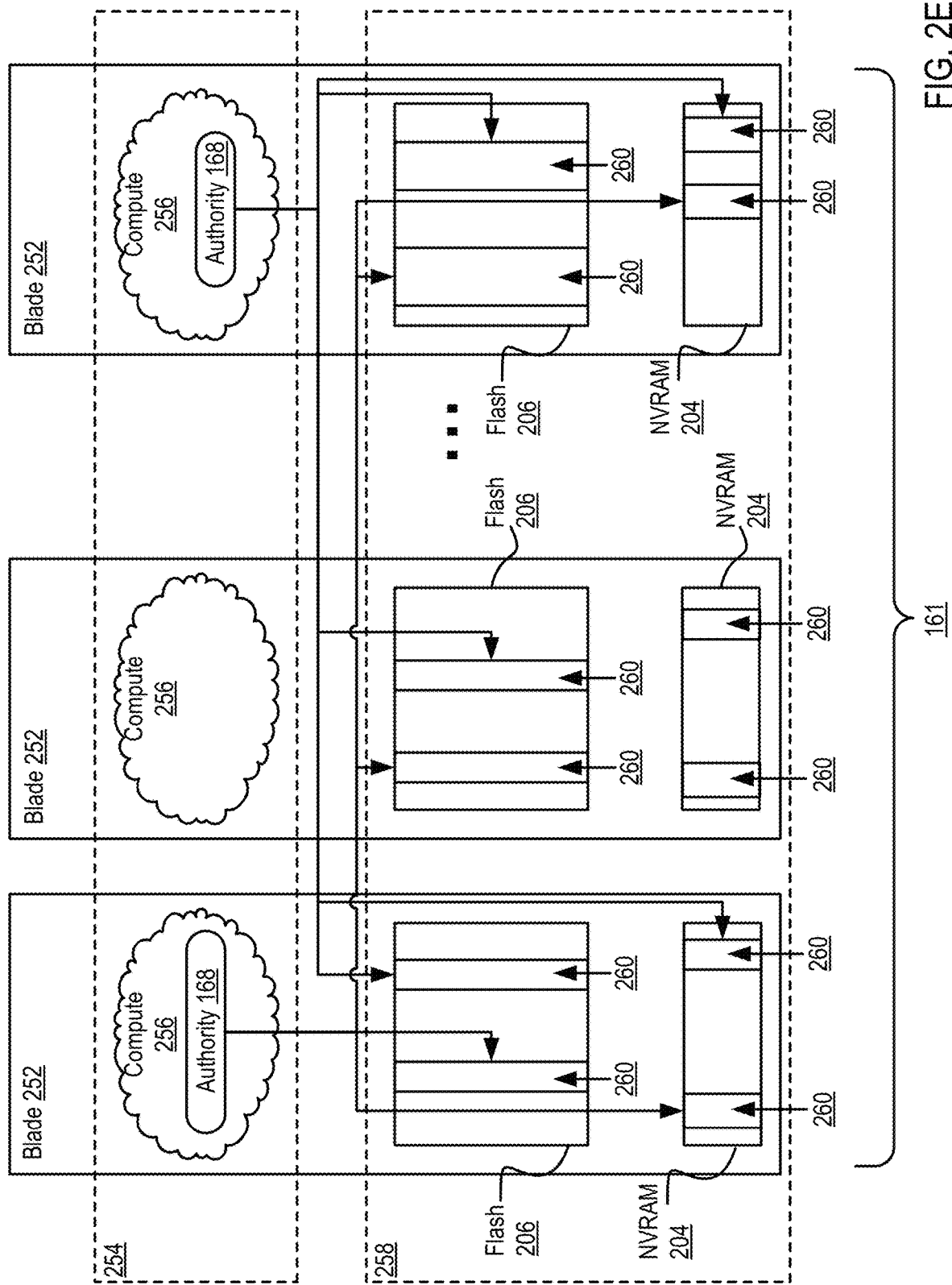

STORAGE SYSTEM SIZING SERVICE

CROSS-REFERENCE TO RELATED APPLICATION

This application is a Non-Provisional Application for patent entitled to a filing date and claiming the benefit of U.S. Provisional Patent Application Ser. No. 62/502,246, filed May 5, 2017.

BRIEF DESCRIPTION OF DRAWINGS

FIG. 2E is a blade hardware block diagram, showing a control plane, compute and storage planes, and authorities interacting with underlying physical resources, in accordance with some embodiments.

DESCRIPTION OF EMBODIMENTS

Figure 1A:
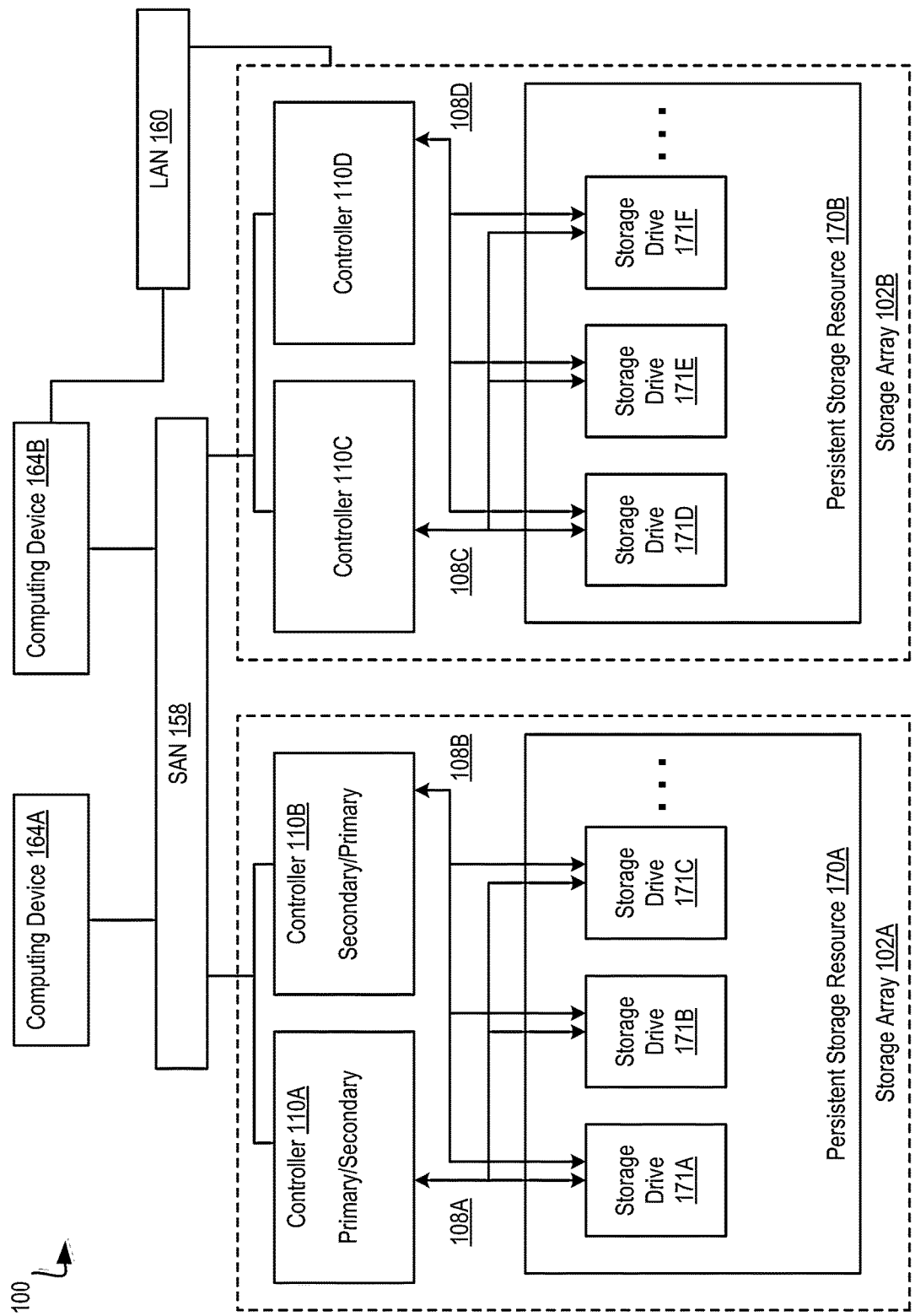
FIG. 1A illustrates a first example system for data storage in accordance with some implementations.

Example methods, apparatus, and products for storage system sizing in accordance with embodiments of the present disclosure are described with reference to the accompanying drawings, beginning with FIG. 1A. FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164A-B. Computing devices (also referred to as "client devices" herein) may be embodied, for example, a server in a data center, a workstation, a personal computer, a notebook, or the like. Computing devices 164A-B may be coupled for data communications to one or more storage arrays 102A-B through a storage area network ('SAN') 158 or a local area network ('LAN') 160.

The SAN 158 may be implemented with a variety of data communications fabrics, devices, and protocols. For example, the fabrics for SAN 158 may include Fibre Channel, Ethernet, Infiniband, Serial Attached Small Computer System Interface ('SAS'), or the like. Data communications protocols for use with SAN 158 may include Advanced Technology Attachment ('ATA'), Fibre Channel Protocol, Small Computer System Interface ('SCSI'), Internet Small Computer System Interface ('iSCSI'), HyperSCSI, Non-Volatile Memory Express ('NVMe') over Fabrics, or the like. It may be noted that SAN 158 is provided for illustration, rather than limitation. Other data communication couplings may be implemented between computing devices 164A-B and storage arrays 102A-B.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol ('TCP'), User Datagram Protocol ('UDP'), Internet Protocol ('IP'), HyperText Transfer Protocol ('HTTP'), Wireless Access Protocol ('WAP'), Handheld Device Transport Protocol ('HDTP'), Session Initiation Protocol ('SIP'), Real Time Protocol ('RTP'), or the like.

Storage arrays 102A-B may provide persistent data storage for the computing devices 164A-B. Storage array 102A may be contained in a chassis (not shown), and storage array 102B may be contained in another chassis (not shown), in implementations. Storage array 102A and 102B may include one or more storage array controllers 110A-D (also referred to as "controller" herein). A storage array controller 110A-D may be embodied as a module of automated computing machinery comprising computer hardware, computer software, or a combination of computer hardware and software. In some implementations, the storage array controllers 110A-D may be configured to carry out various storage tasks. Storage tasks may include writing data received from the computing devices 164A-B to storage array 102A-B, erasing data from storage array 102A-B, retrieving data from storage array 102A-B and providing data to computing devices 164A-B, monitoring and reporting of disk utilization and performance, performing redundancy operations, such as Redundant Array of Independent Drives ('RAID') or RAID-like data redundancy operations, compressing data, encrypting data, and so forth.

Storage array controller 110A-D may be implemented in a variety of ways, including as a Field Programmable Gate Array ('FPGA'), a Programmable Logic Chip ('PLC'), an Application Specific Integrated Circuit ('ASIC'), System-on-Chip ('SOC'), or any computing device that includes discrete components such as a processing device, central processing unit, computer memory, or various adapters. Storage array controller 110A-D may include, for example, a data communications adapter configured to support communications via the SAN 158 or LAN 160. In some implementations, storage array controller 110A-D may be independently coupled to the LAN 160. In implementations, storage array controller 110A-D may include an I/O controller or the like that couples the storage array controller 110A-D for data communications, through a midplane (not shown), to a persistent storage resource 170A-B (also referred to as a "storage resource" herein). The persistent storage resource 170A-B main include any number of storage drives 171A-F (also referred to as "storage devices" herein) and any number of non-volatile Random Access Memory ('NVRAM') devices (not shown).

In some implementations, the NVRAM devices of a persistent storage resource 170A-B may be configured to receive, from the storage array controller 110A-D, data to be stored in the storage drives 171A-F. In some examples, the data may originate from computing devices 164A-B. In some examples, writing data to the NVRAM device may be carried out more quickly than directly writing data to the storage drive 171A-F. In implementations, the storage array controller 110A-D may be configured to utilize the NVRAM devices as a quickly accessible buffer for data destined to be written to the storage drives 171A-F. Latency for write requests using NVRAM devices as a buffer may be improved relative to a system in which a storage array controller 110A-D writes data directly to the storage drives 171A-F. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171A-F.

In implementations, storage drive 171A-F may refer to any device configured to record data persistently, where "persistently" or "persistent" refers to a device's ability to maintain recorded data after loss of power. In some implementations, storage drive 171A-F may correspond to non-disk storage media. For example, the storage drive 171A-F may be one or more solid-state drives ('SSDs'), flash memory based storage, any type of solid-state non-volatile memory, or any other type of non-mechanical storage device. In other implementations, storage drive 171A-F may include mechanical or spinning hard disk, such as hard-disk drives ('HDD').

In some implementations, the storage array controllers 110A-D may be configured for offloading device management responsibilities from storage drive 171A-F in storage array 102A-B. For example, storage array controllers 110A-D may manage control information that may describe the state of one or more memory blocks in the storage drives 171A-F. The control information may indicate, for example, that a particular memory block has failed and should no longer be written to, that a particular memory block contains boot code for a storage array controller 110A-D, the number of program-erase ('P/E') cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171A-F may be stored in one or more particular memory blocks of the storage drives 171A-F that are selected by the storage array controller 110A-D. The selected memory blocks may be tagged with an identifier indicating that the selected memory block contains control information. The identifier may be utilized by the storage array controllers 110A-D in conjunction with storage drives 171A-F to quickly identify the memory blocks that contain control information. For example, the storage controllers 110A-D may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171A-F.

In implementations, storage array controllers 110A-D may offload device management responsibilities from storage drives 171A-F of storage array 102A-B by retrieving, from the storage drives 171A-F, control information describing the state of one or more memory blocks in the storage drives 171A-F. Retrieving the control information from the storage drives 171A-F may be carried out, for example, by the storage array controller 110A-D querying the storage drives 171A-F for the location of control information for a particular storage drive 171A-F. The storage drives 171A-F may be configured to execute instructions that enable the storage drive 171A-F to identify the location of the control information. The instructions may be executed by a controller (not shown) associated with or otherwise located on the storage drive 171A-F and may cause the storage drive 171A-F to scan a portion of each memory block to identify the memory blocks that store control information for the storage drives 171A-F. The storage drives 171A-F may respond by sending a response message to the storage array controller 110A-D that includes the location of control information for the storage drive 171A-F. Responsive to receiving the response message, storage array controllers 110A-D may issue a request to read data stored at the address associated with the location of control information for the storage drives 171A-F.

In other implementations, the storage array controllers 110A-D may further offload device management responsibilities from storage drives 171A-F by performing, in response to receiving the control information, a storage drive management operation. A storage drive management operation may include, for example, an operation that is typically performed by the storage drive 171A-F (e.g., the controller (not shown) associated with a particular storage drive 171A-F). A storage drive management operation may include, for example, ensuring that data is not written to failed memory blocks within the storage drive 171A-F, ensuring that data is written to memory blocks within the storage drive 171A-F in such a way that adequate wear leveling is achieved, and so forth.

In implementations, storage array 102A-B may implement two or more storage array controllers 110A-D. For example, storage array 102A may include storage array controllers 110A and storage array controllers 110B. At a given instance, a single storage array controller 110A-D (e.g., storage array controller 110A) of a storage system 100 may be designated with primary status (also referred to as "primary controller" herein), and other storage array controllers 110A-D (e.g., storage array controller 110A) may be designated with secondary status (also referred to as "secondary controller" herein). The primary controller may have particular rights, such as permission to alter data in persistent storage resource 170A-B (e.g., writing data to persistent storage resource 170A-B). At least some of the rights of the primary controller may supersede the rights of the secondary controller. For instance, the secondary controller may not have permission to alter data in persistent storage resource 170A-B when the primary controller has the right. The status of storage array controllers 110A-D may change. For example, storage array controller 110A may be designated with secondary status, and storage array controller 110B may be designated with primary status.

In some implementations, a primary controller, such as storage array controller 110A, may serve as the primary controller for one or more storage arrays 102A-B, and a second controller, such as storage array controller 110B, may serve as the secondary controller for the one or more storage arrays 102A-B. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171A-F. It may be noted that in some implementations storage processing modules may be used to increase the number of storage drives controlled by the primary and secondary controllers.

In implementations, storage array controllers 110A-D are communicatively coupled, via a midplane (not shown), to one or more storage drives 171A-F and to one or more NVRAM devices (not shown) that are included as part of a storage array 102A-B. The storage array controllers 110A-D may be coupled to the midplane via one or more data communication links and the midplane may be coupled to the storage drives 171A-F and the NVRAM devices via one or more data communications links. The data communications links described herein are collectively illustrated by data communications links 108A-D and may include a Peripheral Component Interconnect Express ('PCIe') bus, for example.

Figure 1B:
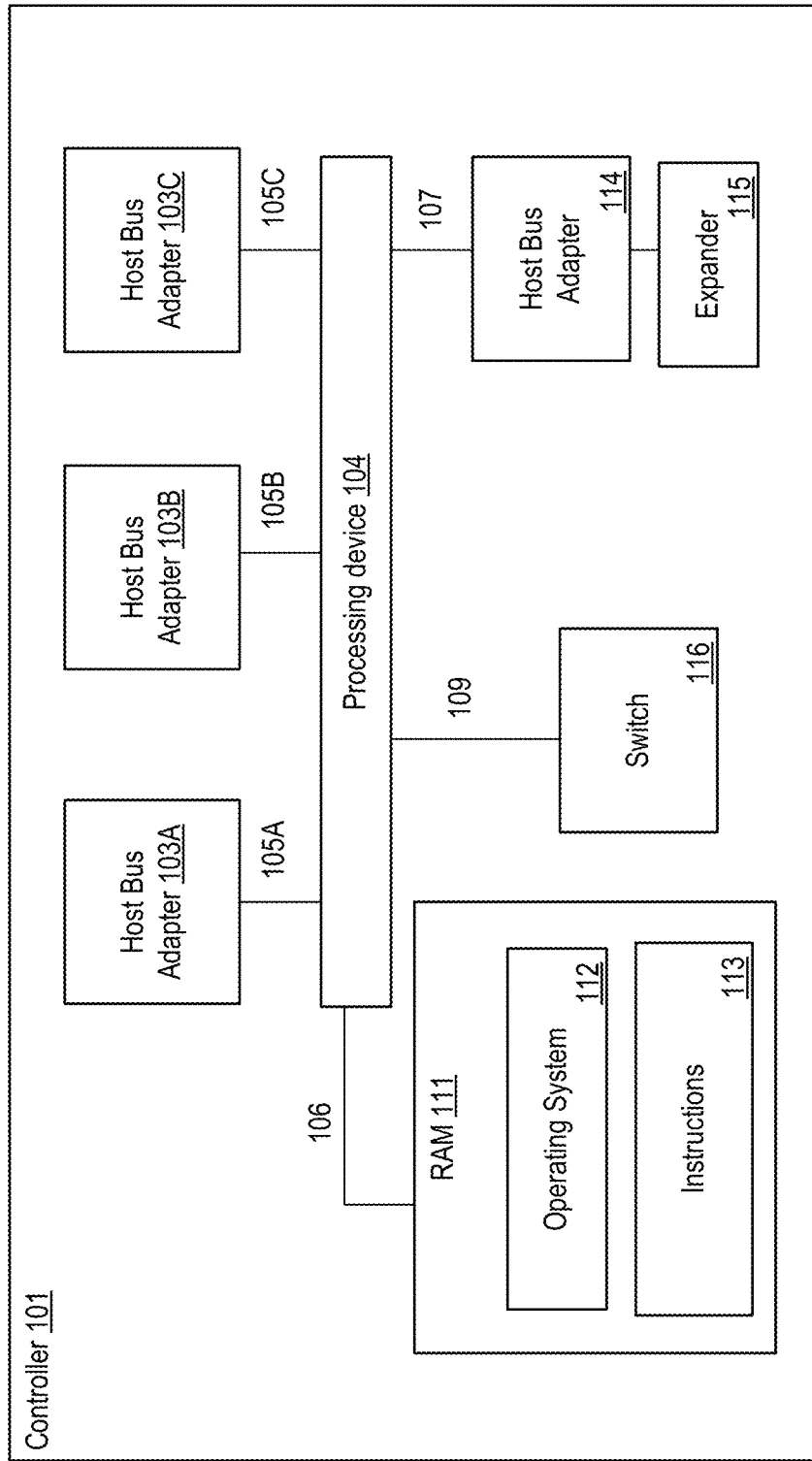
FIG. 1B illustrates a second example system for data storage in accordance with some implementations.

FIG. 1B illustrates an example system for data storage, in accordance with some implementations. Storage array controller 101 illustrated in FIG. 1B may be similar to the storage array controllers 110A-D described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory ('RAM') 111. Processing device 104 (or controller 101) represents one or more general-purpose processing devices such as a microprocessor, central processing unit, or the like. More particularly, the processing device 104 (or controller 101) may be a complex instruction set computing ('CISC') microprocessor, reduced instruction set computing ('RISC') microprocessor, very long instruction word ('VLIW') microprocessor, or a processor implementing other instruction sets or processors implementing a combination of instruction sets. The processing device 104 (or controller 101) may also be one or more special-purpose processing devices such as an application specific integrated circuit ('ASIC'), a field programmable gate array ('FPGA'), a digital signal processor ('DSP'), network processor, or the like.

The processing device 104 may be connected to the RAM 111 via a data communications link 106, which may be embodied as a high speed memory bus such as a Double-Data Rate 4 ('DDR4') bus. Stored in RAM 111 is an operating system 112. In some implementations, instructions 113 are stored in RAM 111. Instructions 113 may include computer program instructions for performing operations in a direct-mapped flash storage system. In one embodiment, a direct-mapped flash storage system is one that addresses data blocks within flash drives directly and without an address translation performed by the storage controllers of the flash drives.

In implementations, storage array controller 101 includes one or more host bus adapters 103A-C that are coupled to the processing device 104 via a data communications link 105A-C. In implementations, host bus adapters 103A-C may be computer hardware that connects a host system (e.g., the storage array controller) to other network and storage arrays. In some examples, host bus adapters 103A-C may be a Fibre Channel adapter that enables the storage array controller 101 to connect to a SAN, an Ethernet adapter that enables the storage array controller 101 to connect to a LAN, or the like. Host bus adapters 103A-C may be coupled to the processing device 104 via a data communications link 105A-C such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is in contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
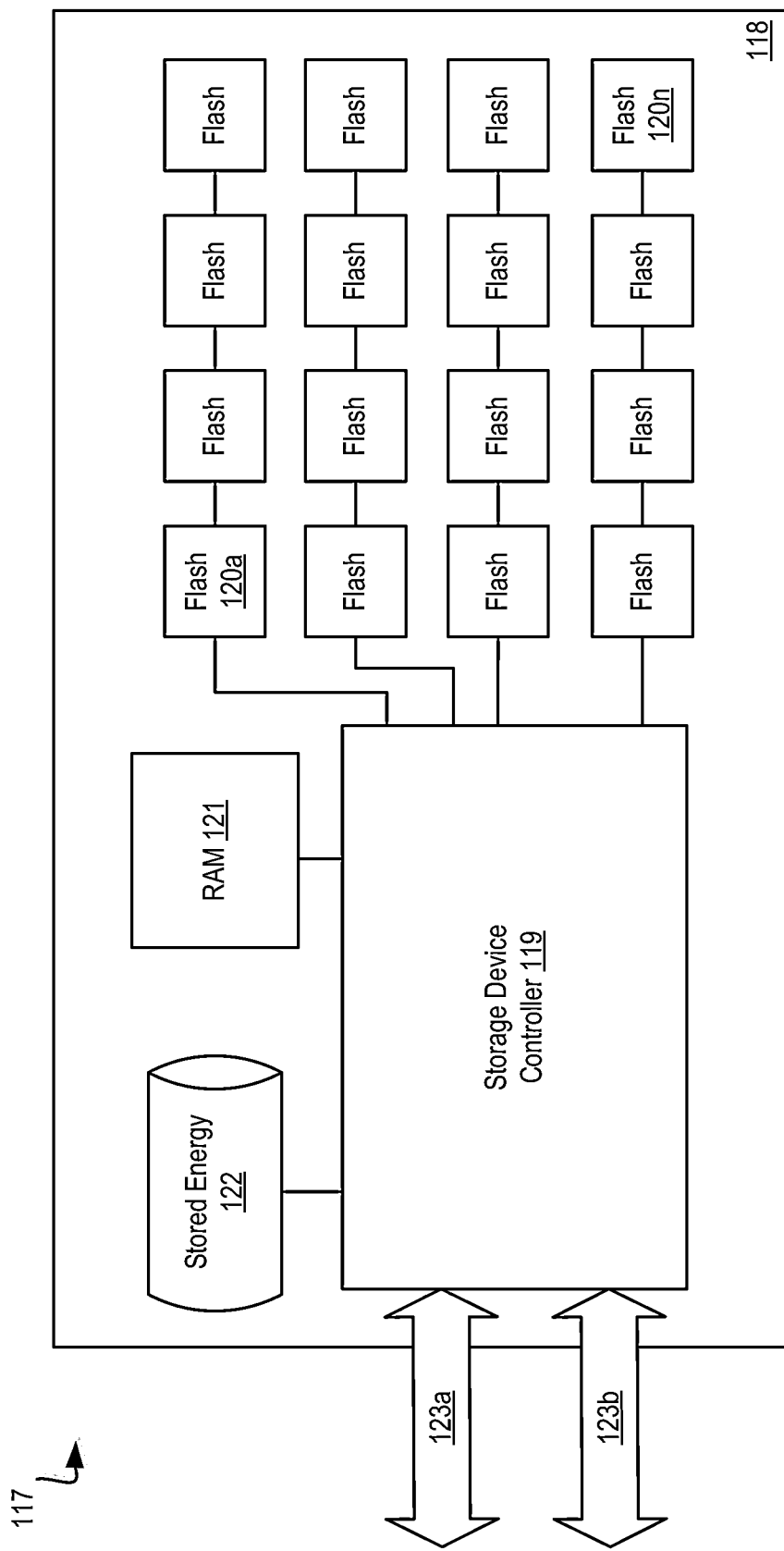
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect ('PCI') flash storage device 118 with separately addressable fast write storage. System 117 may include a storage controller 119. In one embodiment, storage controller 119A-D may be a CPU, ASIC, FPGA, or any other circuitry that may implement control structures necessary according to the present disclosure. In one embodiment, system 117 includes flash memory devices (e.g., including flash memory devices 120*a*-*n*), operatively coupled to various channels of the storage device controller 119. Flash memory devices 120*a*-*n*, may be presented to the controller 119A-D as an addressable collection of Flash pages, erase blocks, and/or control elements sufficient to allow the storage device controller 119A-D to program and retrieve various aspects of the Flash. In one embodiment, storage device controller 119A-D may perform operations on flash memory devices 120A-N including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include RAM 121 to store separately addressable fast-write data. In one embodiment, RAM 121 may be one or more separate discrete devices. In another embodiment, RAM 121 may be integrated into storage device controller 119A-D or multiple storage device controllers. The RAM 121 may be utilized for other purposes as well, such as temporary program memory for a processing device (e.g., a CPU) in the storage device controller 119.

In one embodiment, system 119A-D may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120*a*-120*n*) for sufficient time to write the contents of RAM to Flash memory. In one embodiment, storage device controller 119A-D may write the contents of RAM to Flash Memory if the storage device controller detects loss of external power.

In one embodiment, system 117 includes two data communications links 123*a*, 123*b*. In one embodiment, data communications links 123*a*, 123*b* may be PCI interfaces. In another embodiment, data communications links 123*a*, 123*b* may be based on other communications standards (e.g., HyperTransport, InfiniBand, etc.). Data communications links 123*a*, 123*b* may be based on non-volatile memory express ('NVMe') or NVMe over fabrics ('NVMf') specifications that allow external connection to the storage device controller 119A-D from other components in the storage system 117. It should be noted that data communications links may be interchangeably referred to herein as PCI buses for convenience.

System 117 may also include an external power source (not shown), which may be provided over one or both data communications links 123*a*, 123*b*, or which may be provided separately. An alternative embodiment includes a separate Flash memory (not shown) dedicated for use in storing the content of RAM 121. The storage device controller 119A-D may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119A-D may write stored content associated with the addressable fast-write logical storage to Flash memory (e.g., Flash memory 120*a-n*) for long-term persistent storage.

In one embodiment, the logical device may include some presentation of some or all of the content of the Flash memory devices 120*a-n*, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 107*a*-120*n* stored energy device 122 may power storage device controller 119A-D and associated Flash memory devices (e.g., 120*a-n*) for those operations, as well as for the storing of fast-write RAM to Flash memory. Stored energy device 122 may be used to store accumulated statistics and other parameters kept and tracked by the Flash memory devices 120*a-n* and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

Figure 1D:
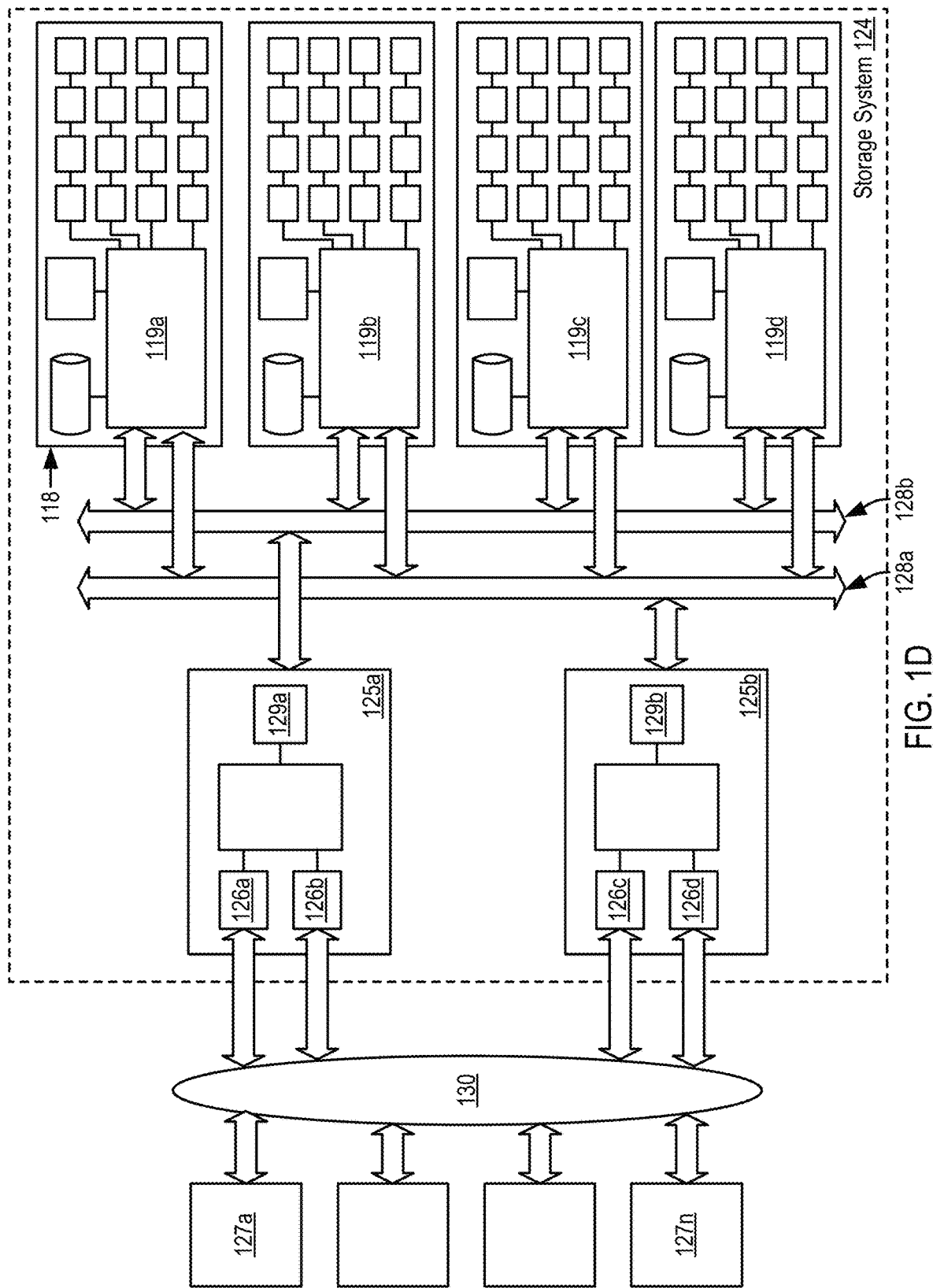
FIG. 1D illustrates a fourth example system for data storage in accordance with some implementations.

FIG. 1D illustrates a third example system 124 for data storage in accordance with some implementations. In one embodiment, system 124 includes storage controllers 125*a*, 125*b*. In one embodiment, storage controllers 125*a*, 125*b* are operatively coupled to Dual PCI storage devices 119*a*, 119*b* and 119*c*, 119*d*, respectively. Storage controllers 125*a*, 125*b* may be operatively coupled (e.g., via a storage network 130) to some number of host computers 127*a-n*.

In one embodiment, two storage controllers (e.g., 125*a* and 125*b*) provide storage services, such as a SCS) block storage array, a file server, an object server, a database or data analytics service, etc. The storage controllers 125*a*, 125*b* may provide services through some number of network interfaces (e.g., 126*a-d*) to host computers 127*a-n* outside of the storage system 124. Storage controllers 125*a*, 125*b* may provide integrated services or an application entirely within the storage system 124, forming a converged storage and compute system. The storage controllers 125*a*, 125*b* may utilize the fast write memory within or across storage devices 119*a-d* to journal in progress operations to ensure the operations are not lost on a power failure, storage controller removal, storage controller or storage system shutdown, or some fault of one or more software or hardware components within the storage system 124.

In one embodiment, controllers 125*a*, 125*b* operate as PCI masters to one or the other PCI buses 128*a*, 128*b*. In another embodiment, 128*a* and 128*b* may be based on other communications standards (e.g., HyperTransport, InfiniBand, etc.). Other storage system embodiments may operate storage controllers 125*a*, 125*b* as multi-masters for both PCI buses 128*a*, 128*b*. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119*a* may be operable under direction from a storage controller 125*a* to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128*a*, 128*b*) from the storage controllers 125*a*, 125*b*. In one embodiment, a recalculation may include compressing data, attaching indexing or other metadata, combining multiple data segments together, performing erasure code calculations, etc.

In one embodiment, under direction from a storage controller 125*a*, 125*b*, a storage device controller 119*a*, 119*b* may be operable to calculate and transfer data to other storage devices from data stored in RAM (e.g., RAM 121 of FIG. 1C) without involvement of the storage controllers 125*a*, 125*b*. This operation may be used to mirror data stored in one controller 125*a* to another controller 125*b*, or it could be used to offload compression, data aggregation, and/or erasure coding calculations and transfers to storage devices to reduce load on storage controllers or the storage controller interface 129*a*, 129*b* to the PCI bus 128*a*, 128*b*.

A storage device controller 119A-D may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one or more storage devices.

In one embodiment, the storage controllers 125a, 125b may initiate the use of erase blocks within and across storage devices (e.g., 118) in accordance with an age and expected remaining lifespan of the storage devices, or based on other statistics. The storage controllers 125a, 125b may initiate garbage collection and data migration between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as PCIe, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system ('NFS'), common internet file system ('CIFS'), small computer system interface ('SCSI') or hypertext transfer protocol ('HTTP'). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a media access control ('MAC') address, but the storage cluster is presented to an external network as having a single cluster IP address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, DRAM and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded CPU, solid state storage controller, and a quantity of solid state mass storage, e.g., between 2-32 terabytes ('TB') in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory ('MRAM') that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
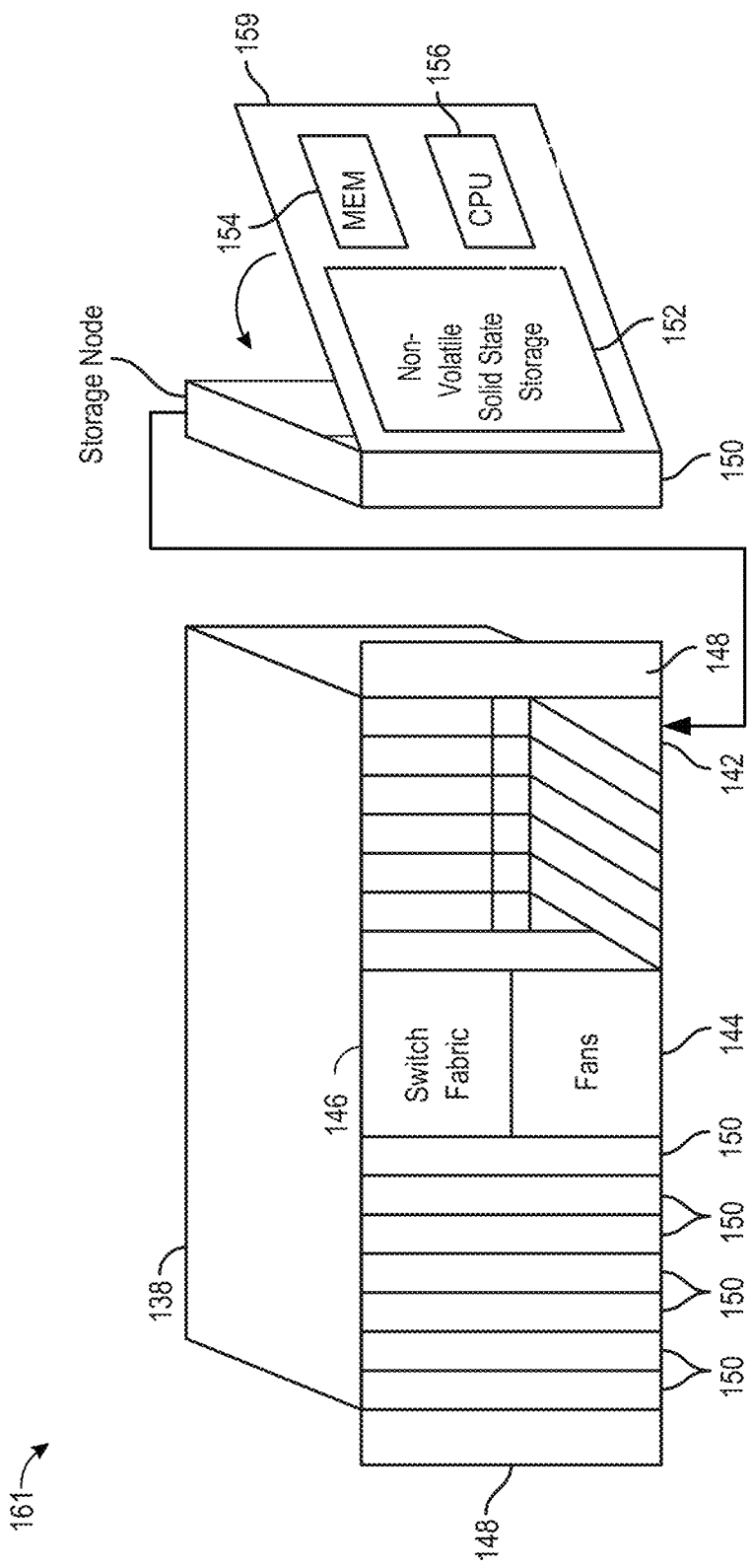
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in herein, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
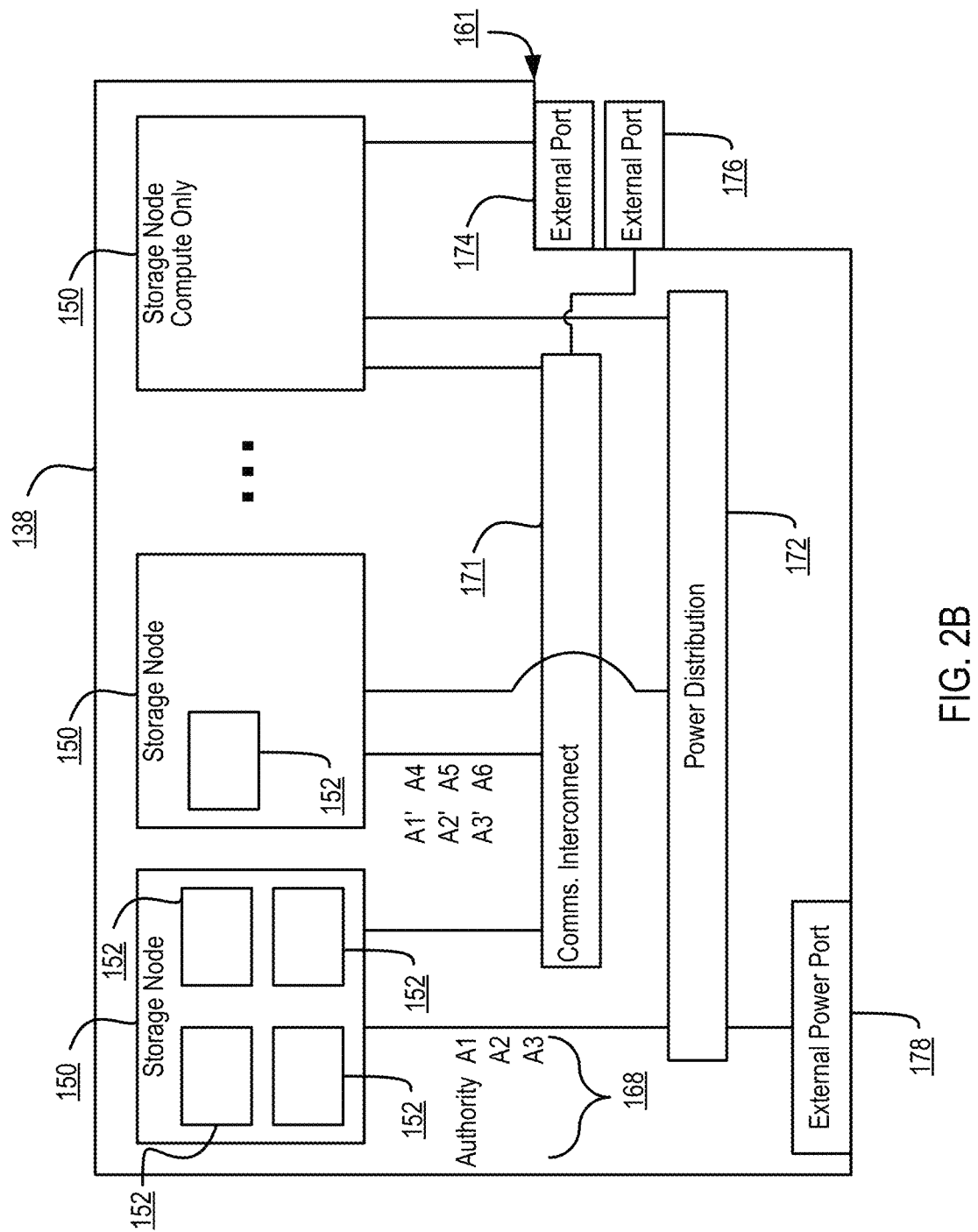
FIG. 2B is a block diagram showing an interconnect switch coupling multiple storage nodes in accordance with some embodiments.

FIG. 2B is a block diagram showing a communications interconnect 173 and power distribution bus 172 coupling multiple storage nodes 150. Referring back to FIG. 2A, the communications interconnect 173 can be included in or implemented with the switch fabric 146 in some embodiments. Where multiple storage clusters 161 occupy a rack, the communications interconnect 173 can be included in or implemented with a top of rack switch, in some embodiments. As illustrated in FIG. 2B, storage cluster 161 is enclosed within a single chassis 138. External port 176 is coupled to storage nodes 150 through communications interconnect 173, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check ('LDPC') code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing ('RUSH') family of hashes, including Controlled Replication Under Scalable Hashing ('CRUSH'). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM, and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
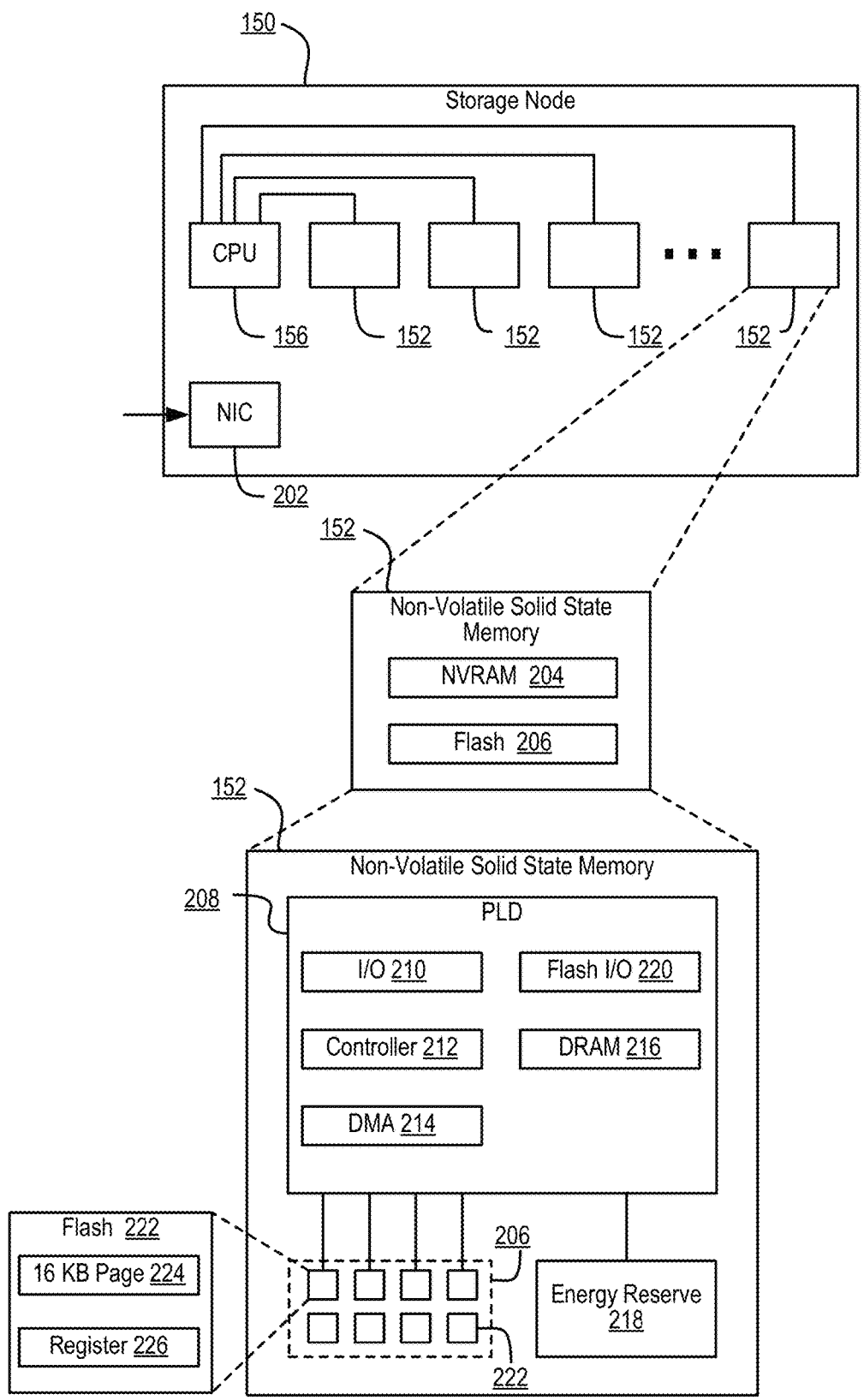
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller ('NIC') 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory ('NVRAM') 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device ('PLD') 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
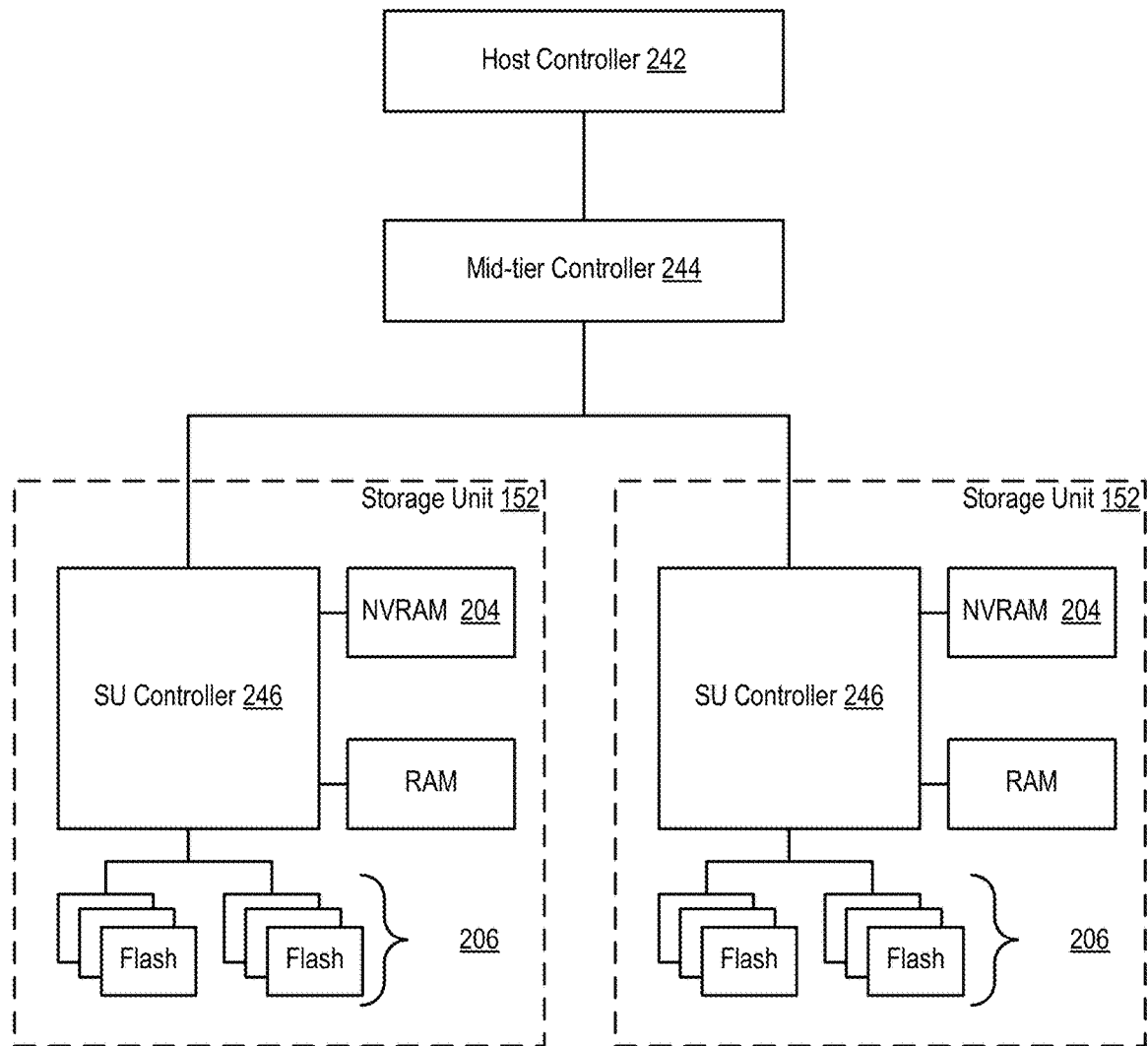
FIG. 2D shows a storage server environment, which uses embodiments of the storage nodes and storage units of some previous figures in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources.

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
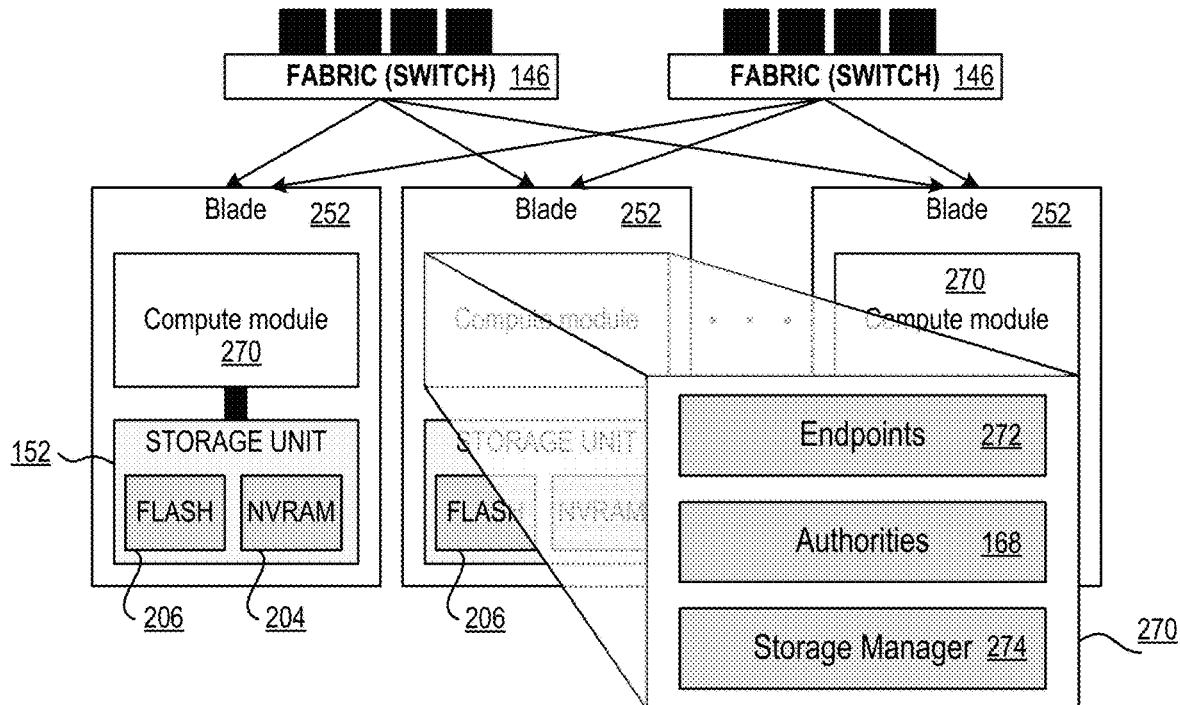
FIG. 2F depicts elasticity software layers in blades of a storage cluster, in accordance with some embodiments.

FIG. 2F depicts elasticity software layers in blades 252 of a storage cluster, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 252 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some embodiments. Thus, when an authority 168 migrates, the authority 168 continues to manage the same storage partitions from its new location. When a new blade 252 is installed in an embodiment of the storage cluster, the system automatically rebalances load by: partitioning the new blade's 252 storage for use by the system's authorities 168, migrating selected authorities 168 to the new blade 252, starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
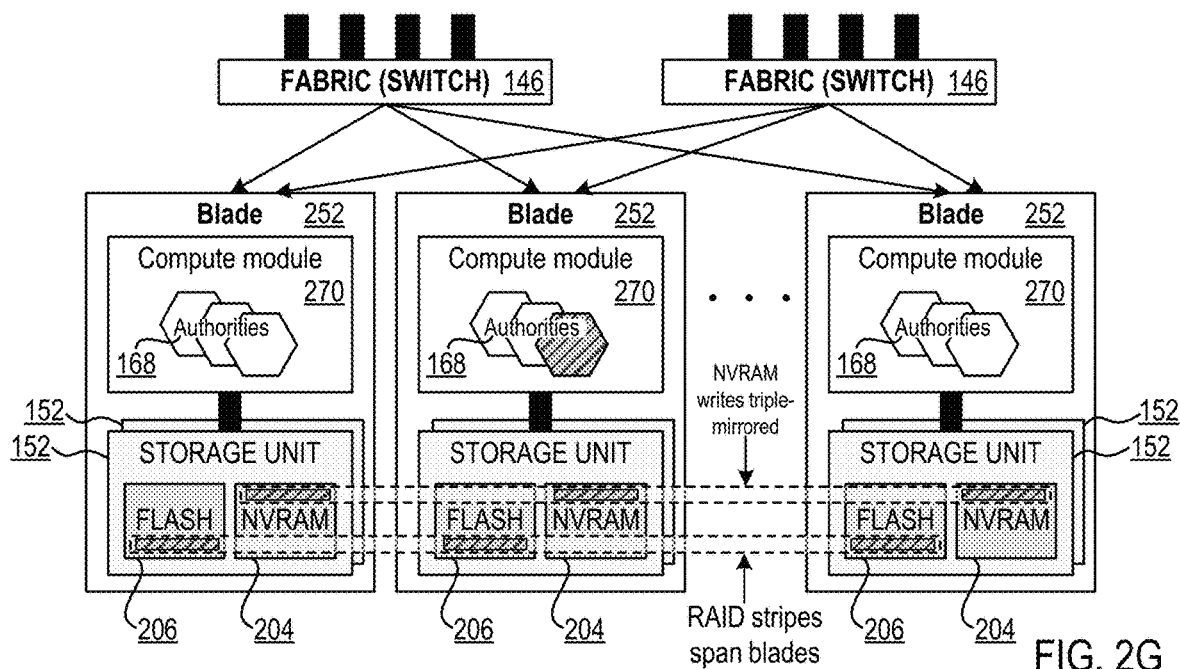
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS™ environment. In these embodiments, LDAP (Lightweight Directory Access Protocol) is one example application protocol for querying and modifying items in directory service providers such as Active Directory. In some embodiments, a network lock manager ('NLM') is utilized as a facility that works in cooperation with the Network File System ('NFS') to provide a System V style of advisory file and record locking over a network. The Server Message Block ('SMB') protocol, one version of which is also known as Common Internet File System ('CIFS'), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list ('ACL'). The ACL is a list of permissions attached to an object and the ACL specifies which users or system processes are granted access to objects, as well as what operations are allowed on given objects. The systems may utilize Internet Protocol version 6 ('IPv6'), as well as IPv4, for the communications protocol that provides an identification and location system for computers on networks and routes traffic across the Internet. The routing of packets between networked systems may include Equal-cost multi-path routing ('ECMP'), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
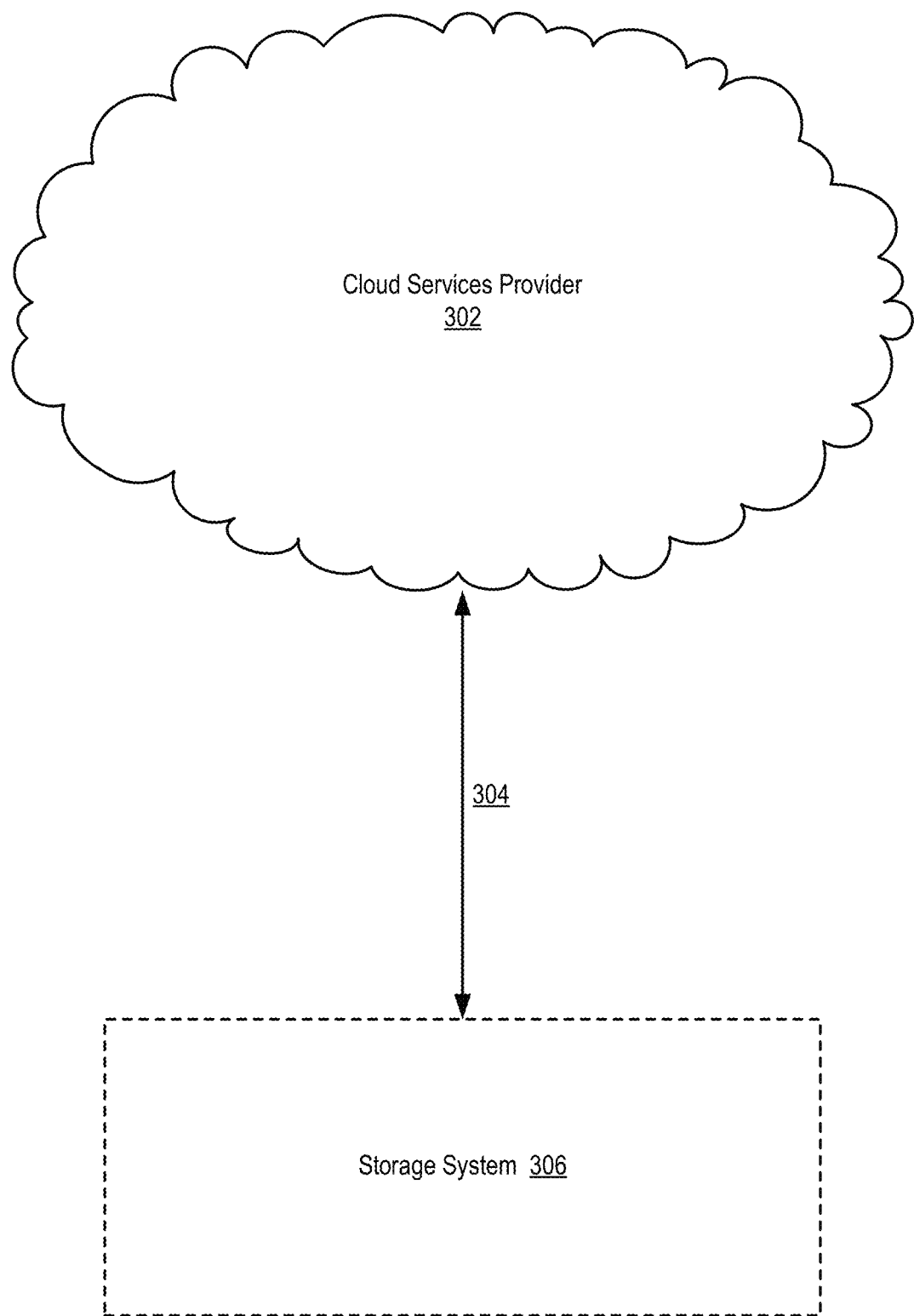
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services to the storage system 306 and users of the storage system 306 through the implementation of an infrastructure as a service ('IaaS') service model where the cloud services provider 302 offers computing infrastructure such as virtual machines and other resources as a service to subscribers. In addition, the cloud services provider 302 may be configured to provide services to the storage system 306 and users of the storage system 306 through the implementation of a platform as a service ('PaaS') service model where the cloud services provider 302 offers a development environment to application developers. Such a development environment may include, for example, an operating system, programming-language execution environment, database, web server, or other components that may be utilized by application developers to develop and run software solutions on a cloud platform. Furthermore, the cloud services provider 302 may be configured to provide services to the storage system 306 and users of the storage system 306 through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services to the storage system 306 and users of the storage system 306 through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on-premises with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive telemetry data phoned home by the storage system 306. Such telemetry data may describe various operating characteristics of the storage system 306 and may be analyzed, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
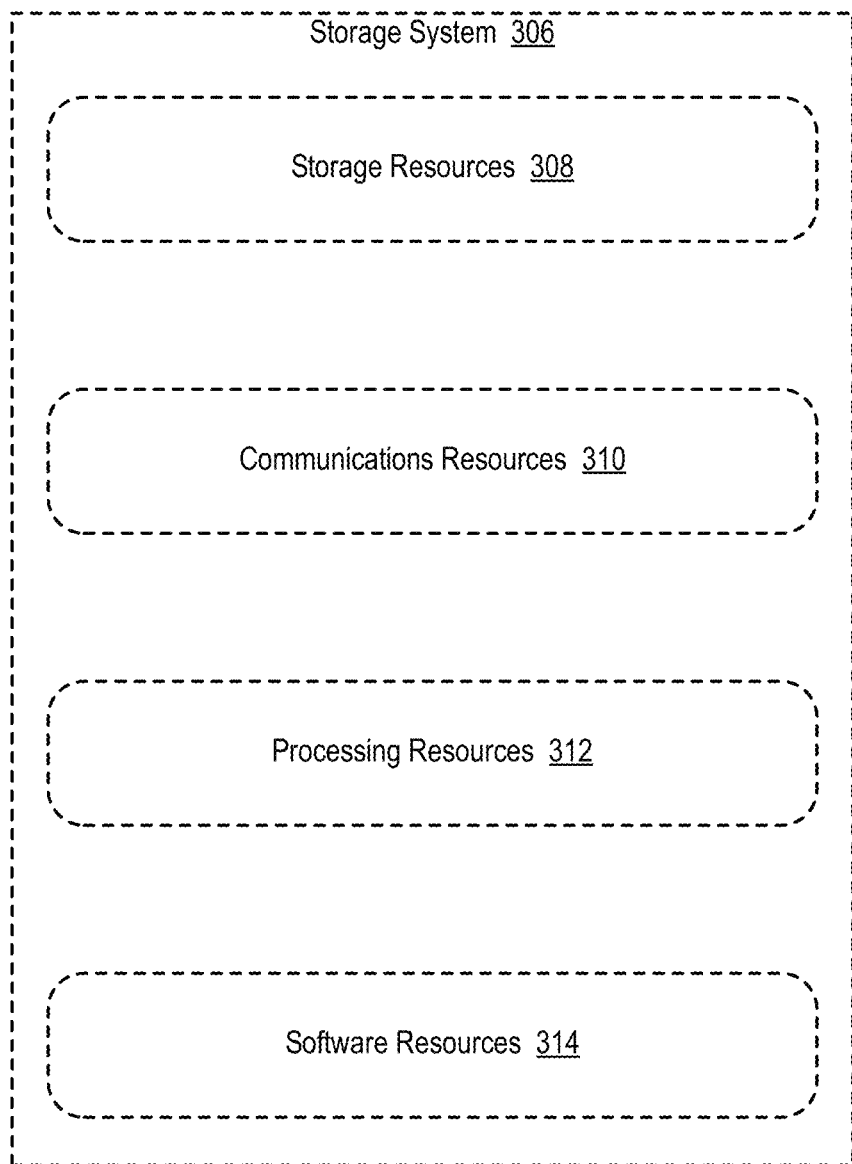
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include storage resources 308, which may be embodied in many forms. For example, in some embodiments the storage resources 308 can include nano-RAM or another form of nonvolatile random access memory that utilizes carbon nanotubes deposited on a substrate. In some embodiments, the storage resources 308 may include 3D crosspoint non-volatile memory in which bit storage is based on a change of bulk resistance, in conjunction with a stackable cross-gridded data access array. In some embodiments, the storage resources 308 may include flash memory, including single-level cell ('SLC') NAND flash, multi-level cell ('MLC') NAND flash, triple-level cell ('TLC') NAND flash, quad-level cell ('QLC') NAND flash, and others. In some embodiments, the storage resources 308 may include non-volatile magnetoresistive random-access memory ('MRAM'), including spin transfer torque ('STT') MRAM, in which data is stored through the use of magnetic storage elements. In some embodiments, the example storage resources 308 may include non-volatile phase-change memory ('PCM') that may have the ability to hold multiple bits in a single cell as cells can achieve a number of distinct intermediary states. In some embodiments, the storage resources 308 may include quantum memory that allows for the storage and retrieval of photonic quantum information. In some embodiments, the example storage resources 308 may include resistive random-access memory ('ReRAM') in which data is stored by changing the resistance across a dielectric solid-state material. In some embodiments, the storage resources 308 may include storage class memory ('SCM') in which solid-state nonvolatile memory may be manufactured at a high density using some combination of sub-lithographic patterning techniques, multiple bits per cell, multiple layers of devices, and so on. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC networks. The communications resources 310 can also include FC over ethernet ('FCoE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that that may be useful in facilitating data communications between components within the storage system 306, as well as data communications between the storage system 306 and computing devices that are outside of the storage system 306.

The storage system 306 depicted in FIG. 3B also includes processing resources 312 that may be useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform various tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the various components depicted in FIG. 3B may be grouped into one or more optimized computing packages as converged infrastructures. Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach (e.g., hyper-converged infrastructures), or in other ways.

Readers will appreciate that the storage system 306 depicted in FIG. 3B may be useful for supporting various types of software applications. For example, the storage system 306 may be useful in supporting artificial intelligence ('AI') applications, database applications, DevOps projects, electronic design automation tools, event-driven software applications, high performance computing applications, simulation applications, high-speed data capture and analysis applications, machine learning applications, media production applications, media serving applications, picture archiving and communication systems ('PACS') applications, software development applications, virtual reality applications, augmented reality applications, and many other types of applications by providing storage resources to such applications.

The storage systems described above may operate to support a wide variety of applications. In view of the fact that the storage systems include compute resources, storage resources, and a wide variety of other resources, the storage systems may be well suited to support applications that are resource intensive such as, for example, AI applications. Such AI applications may enable devices to perceive their environment and take actions that maximize their chance of success at some goal. Examples of such AI applications can include IBM Watson, Microsoft Oxford, Google DeepMind, Baidu Minwa, and others. The storage systems described above may also be well suited to support other types of applications that are resource intensive such as, for example, machine learning applications. Machine learning applications may perform various types of data analysis to automate analytical model building. Using algorithms that iteratively learn from data, machine learning applications can enable computers to learn without being explicitly programmed.

In addition to the resources already described, the storage systems described above may also include graphics processing units ('GPUs'), occasionally referred to as visual processing unit ('VPUs'). Such GPUs may be embodied as specialized electronic circuits that rapidly manipulate and alter memory to accelerate the creation of images in a frame buffer intended for output to a display device. Such GPUs may be included within any of the computing devices that are part of the storage systems described above, including as one of many individually scalable components of a storage system, where other examples of individually scalable components of such storage system can include storage components, memory components, compute components (e.g., CPUs, FPGAs, ASICs), networking components, software components, and others. In addition to GPUs, the storage systems described above may also include neural network processors ('NNPs') for use in various aspects of neural network processing. Such NNPs may be used in place of (or in addition to) GPUs and may also be independently scalable.

As described above, the storage systems described herein may be configured to support artificial intelligence applications, machine learning applications, big data analytics applications, and many other types of applications. The rapid growth in these sort of applications is being driven by three technologies: deep learning (DL), GPU processors, and Big Data. Deep learning is a computing model that makes use of massively parallel neural networks inspired by the human brain. Instead of experts handcrafting software, a deep learning model writes its own software by learning from lots of examples. A GPU is a modern processor with thousands of cores, well-suited to run algorithms that loosely represent the parallel nature of the human brain.

Advances in deep neural networks have ignited a new wave of algorithms and tools for data scientists to tap into their data with artificial intelligence (AI). With improved algorithms, larger data sets, and various frameworks (including open-source software libraries for machine learning across a range of tasks), data scientists are tackling new use cases like autonomous driving vehicles, natural language processing and understanding, computer vision, machine reasoning, strong AI, and many others. Applications of such techniques may include: machine and vehicular object detection, identification and avoidance; visual recognition, classification and tagging; algorithmic financial trading strategy performance management; simultaneous localization and mapping; predictive maintenance of high-value machinery; prevention against cyber security threats, expertise automation; image recognition and classification; question answering; robotics; text analytics (extraction, classification) and text generation and translation; and many others. Applications of AI techniques has materialized in a wide array of products include, for example, Amazon Echo's speech recognition technology that allows users to talk to their machines, Google Translate™ which allows for machine-based language translation, Spotify's Discover Weekly that provides recommendations on new songs and artists that a user may like based on the user's usage and traffic analysis, Quill's text generation offering that takes structured data and turns it into narrative stories, Chatbots that provide real-time, contextually specific answers to questions in a dialog format, and many others. Furthermore, AI may impact a wide variety of industries and sectors. For example, AI solutions may be used in healthcare to take clinical notes, patient files, research data, and other inputs to generate potential treatment options for doctors to explore. Likewise, AI solutions may be used by retailers to personalize consumer recommendations based on a person's digital footprint of behaviors, profile data, or other data.

Data is the heart of modern AI and deep learning algorithms. Before training can begin, one problem that must be addressed revolves around collecting the labeled data that is crucial for training an accurate AI model. A full scale AI deployment may be required to continuously collect, clean, transform, label, and store large amounts of data. Adding additional high quality data points directly translates to more accurate models and better insights. Data samples may undergo a series of processing steps including, but not limited to: 1) ingesting the data from an external source into the training system and storing the data in raw form, 2) cleaning and transforming the data in a format convenient for training, including linking data samples to the appropriate label, 3) exploring parameters and models, quickly testing with a smaller dataset, and iterating to converge on the most promising models to push into the production cluster, 4) executing training phases to select random batches of input data, including both new and older samples, and feeding those into production GPU servers for computation to update model parameters, and 5) evaluating including using a holdback portion of the data not used in training in order to evaluate model accuracy on the holdout data. This lifecycle may apply for any type of parallelized machine learning, not just neural networks or deep learning. For example, standard machine learning frameworks may rely on CPUs instead of GPUs but the data ingest and training workflows may be the same. Readers will appreciate that a single shared storage data hub creates a coordination point throughout the lifecycle without the need for extra data copies among the ingest, preprocessing, and training stages. Rarely is the ingested data used for only one purpose, and shared storage gives the flexibility to train multiple different models or apply traditional analytics to the data.

Readers will appreciate that each stage in the AI data pipeline may have varying requirements from the data hub (e.g., the storage system or collection of storage systems). Scale-out storage systems must deliver uncompromising performance for all manner of access types and patterns—from small, metadata-heavy to large files, from random to sequential access patterns, and from low to high concurrency. The storage systems described above may serve as an ideal AI data hub as the systems may service unstructured workloads. In the first stage, data is ideally ingested and stored on to the same data hub that following stages will use, in order to avoid excess data copying. The next two steps can be done on a standard compute server that optionally includes a GPU, and then in the fourth and last stage, full training production jobs are run on powerful GPU-accelerated servers. Often, there is a production pipeline alongside an experimental pipeline operating on the same dataset. Further, the GPU-accelerated servers can be used independently for different models or joined together to train on one larger model, even spanning multiple systems for distributed training. If the shared storage tier is slow, then data must be copied to local storage for each phase, resulting in wasted time staging data onto different servers. The ideal data hub for the AI training pipeline delivers performance similar to data stored locally on the server node while also having the simplicity and performance to enable all pipeline stages to operate concurrently.

A data scientist works to improve the usefulness of the trained model through a wide variety of approaches: more data, better data, smarter training, and deeper models. In many cases, there will be teams of data scientists sharing the same datasets and working in parallel to produce new and improved training models. Often, there is a team of data scientists working within these phases concurrently on the same shared datasets. Multiple, concurrent workloads of data processing, experimentation, and full-scale training layer the demands of multiple access patterns on the storage tier. In other words, storage cannot just satisfy large file reads, but must contend with a mix of large and small file reads and writes. Finally, with multiple data scientists exploring datasets and models, it may be critical to store data in its native format to provide flexibility for each user to transform, clean, and use the data in a unique way. The storage systems described above may provide a natural shared storage home for the dataset, with data protection redundancy (e.g., by using RAID6) and the performance necessary to be a common access point for multiple developers and multiple experiments. Using the storage systems described above may avoid the need to carefully copy subsets of the data for local work, saving both engineering and GPU-accelerated servers use time. These copies become a constant and growing tax as the raw data set and desired transformations constantly update and change.

Readers will appreciate that a fundamental reason why deep learning has seen a surge in success is the continued improvement of models with larger data set sizes. In contrast, classical machine learning algorithms, like logistic regression, stop improving in accuracy at smaller data set sizes. As such, the separation of compute resources and storage resources may also allow independent scaling of each tier, avoiding many of the complexities inherent in managing both together. As the data set size grows or new data sets are considered, a scale out storage system must be able to expand easily. Similarly, if more concurrent training is required, additional GPUs or other compute resources can be added without concern for their internal storage. Furthermore, the storage systems described above may make building, operating, and growing an AI system easier due to the random read bandwidth provided by the storage systems, the ability to of the storage systems to randomly read small files (50 KB) high rates (meaning that no extra effort is required to aggregate individual data points to make larger, storage-friendly files), the ability of the storage systems to scale capacity and performance as either the dataset grows or the throughput requirements grow, the ability of the storage systems to support files or objects, the ability of the storage systems to tune performance for large or small files (i.e., no need for the user to provision filesystems), the ability of the storage systems to support non-disruptive upgrades of hardware and software even during production model training, and for many other reasons.

Small file performance of the storage tier may be critical as many types of inputs, including text, audio, or images will be natively stored as small files. If the storage tier does not handle small files well, an extra step will be required to pre-process and group samples into larger files. Storage, built on top of spinning disks, that relies on SSD as a caching tier, may fall short of the performance needed. Because training with random input batches results in more accurate models, the entire data set must be accessible with full performance. SSD caches only provide high performance for a small subset of the data and will be ineffective at hiding the latency of spinning drives.

Although the preceding paragraphs discuss deep learning applications, readers will appreciate that the storage systems described herein may also be part of a distributed deep learning ('DDL') platform to support the execution of DDL algorithms. Distributed deep learning can be used to significantly accelerate deep learning with distributed computing on GPUs (or other form of accelerator or computer program instruction executor), such that parallelism can be achieved. In addition, the output of training machine learning and deep learning models, such as a fully trained machine learning model, may be used for a variety of purposes and in conjunction with other tools. For example, trained machine learning models may be used in conjunction with tools like Core MIL to integrate a broad variety of machine learning model types into an application. In fact, trained models may be run through Core ML converter tools and inserted into a custom application that can be deployed on compatible devices. The storage systems described above may also be paired with other technologies such as TensorFlow, an open-source software library for dataflow programming across a range of tasks that may be used for machine learning applications such as neural networks, to facilitate the development of such machine learning models, applications, and so on.

The storage systems described above may also be used in a neuromorphic computing environment. Neuromorphic computing is a form of computing that mimics brain cells. To support neuromorphic computing, an architecture of interconnected "neurons" replace traditional computing models with low-powered signals that go directly between neurons for more efficient computation. Neuromorphic computing may make use of very-large-scale integration (VLSI) systems containing electronic analog circuits to mimic neuro-biological architectures present in the nervous system, as well as analog, digital, mixed-mode analog/digital VLSI, and software systems that implement models of neural systems for perception, motor control, or multisensory integration.

Readers will appreciate that the storage systems described above may be configured to support the storage of (among of types of data) blockchains. Such blockchains may be embodied as a continuously growing list of records, called blocks, which are linked and secured using cryptography. Each block in a blockchain may contain a hash pointer as a link to a previous block, a timestamp, transaction data, and so on. Blockchains may be designed to be resistant to modification of the data and can serve as an open, distributed ledger that can record transactions between two parties efficiently and in a verifiable and permanent way. This makes blockchains potentially suitable for the recording of events, medical records, and other records management activities, such as identity management, transaction processing, and others. In addition to supporting the storage and use of blockchain technologies, the storage systems described above may also support the storage and use of derivative items such as, for example, open source blockchains and related tools that are part of the IBM™ Hyperledger project, permissioned blockchains in which a certain number of trusted parties are allowed to access the block chain, blockchain products that enable developers to build their own distributed ledger projects, and others. Readers will appreciate that blockchain technologies may impact a wide variety of industries and sectors. For example, blockchain technologies may be used in real estate transactions as blockchain based contracts whose use can eliminate the need for 3rd parties and enable self-executing actions when conditions are met. Likewise, universal health records can be created by aggregating and placing a person's health history onto a blockchain ledger for any healthcare provider, or permissioned health care providers, to access and update.

Readers will further appreciate that in some embodiments, the storage systems described above may be paired with other resources to support the applications described above. For example, one infrastructure could include primary compute in the form of servers and workstations which specialize in using General-purpose computing on graphics processing units ('GPGPU') to accelerate deep learning applications that are interconnected into a computation engine to train parameters for deep neural networks. Each system may have Ethernet external connectivity, InfiniBand external connectivity, some other form of external connectivity, or some combination thereof. In such an example, the GPUs can be grouped for a single large training or used independently to train multiple models. The infrastructure could also include a storage system such as those described above to provide, for example, a scale-out all-flash file or object store through which data can be accessed via high-performance protocols such as NFS, S3, and so on. The infrastructure can also include, for example, redundant top-of-rack Ethernet switches connected to storage and compute via ports in MLAG port channels for redundancy. The infrastructure could also include additional compute in the form of whitebox servers, optionally with GPUs, for data ingestion, pre-processing, and model debugging. Readers will appreciate that additional infrastructures are also possible.

Readers will appreciate that the systems described above may be better suited for the applications described above relative to other systems that may include, for example, a distributed direct-attached storage (DDAS) solution deployed in server nodes. Such DDAS solutions may be built for handling large, less sequential accesses but may be less able to handle small, random accesses. Readers will further appreciate that the storage systems described above may be utilized to provide a platform for the applications described above that is preferable to the utilization of cloud-based resources as the storage systems may be included in an on-site or in-house infrastructure that is more secure, more locally and internally managed, more robust in feature sets and performance, or otherwise preferable to the utilization of cloud-based resources as part of a platform to support the applications described above. For example, services built on platforms such as IBM's Watson may require a business enterprise to distribute individual user information, such as financial transaction information or identifiable patient records, to other institutions. As such, cloud-based offerings of AI as a service may be less desirable than internally managed and offered AI as a service that is supported by storage systems such as the storage systems described above, for a wide array of technical reasons as well as for various business reasons.

Readers will appreciate that the storage systems described above, either alone or in coordination with other computing machinery may be configured to support other AI related tools. For example, the storage systems may make use of tools like ONXX or other open neural network exchange formats that make it easier to transfer models written in different AI frameworks. Likewise, the storage systems may be configured to support tools like Amazon's Gluon that allow developers to prototype, build, and train deep learning models. In fact, the storage systems described above may be part of a larger platform, such as IBM™ Cloud Private for Data, that includes integrated data science, data engineering and application building services. Such platforms may seamlessly collect, organize, secure, and analyze data across an enterprise, as well as simplify hybrid data management, unified data governance and integration, data science and business analytics with a single solution.

Readers will further appreciate that the storage systems described above may also be deployed as an edge solution. Such an edge solution may be in place to optimize cloud computing systems by performing data processing at the edge of the network, near the source of the data. Edge computing can push applications, data and computing power (i.e., services) away from centralized points to the logical extremes of a network. Through the use of edge solutions such as the storage systems described above, computational tasks may be performed using the compute resources provided by such storage systems, data may be storage using the storage resources of the storage system, and cloud-based services may be accessed through the use of various resources of the storage system (including networking resources). By performing computational tasks on the edge solution, storing data on the edge solution, and generally making use of the edge solution, the consumption of expensive cloud-based resources may be avoided and, in fact, performance improvements may be experienced relative to a heavier reliance on cloud-based resources.

While many tasks may benefit from the utilization of an edge solution, some particular uses may be especially suited for deployment in such an environment. For example, devices like drones, autonomous cars, robots, and others may require extremely rapid processing so fast, in fact, that sending data up to a cloud environment and back to receive data processing support may simply be too slow. Likewise, machines like locomotives and gas turbines that generate large amounts of information through the use of a wide array of data-generating sensors may benefit from the rapid data processing capabilities of an edge solution. As an additional example, some IoT devices such as connected video cameras may not be well-suited for the utilization of cloud-based resources as it may be impractical (not only from a privacy perspective, security perspective, or a financial perspective) to send the data to the cloud simply because of the pure volume of data that is involved. As such, many tasks that really on data processing, storage, or communications may be better suited by platforms that include edge solutions such as the storage systems described above.

Consider a specific example of inventory management in a warehouse, distribution center, or similar location. A large inventory, warehousing, shipping, order-fulfillment, manufacturing or other operation has a large amount of inventory on inventory shelves, and high resolution digital cameras that produce a firehose of large data. All of this data may be taken into an image processing system, which may reduce the amount of data to a firehose of small data. All of the small data may be stored on-premises in storage. The on-premises storage, at the edge of the facility, may be coupled to the cloud, for external reports, real-time control and cloud storage. Inventory management may be performed with the results of the image processing, so that inventory can be tracked on the shelves and restocked, moved, shipped, modified with new products, or discontinued/obsolescent products deleted, etc. The above scenario is a prime candidate for an embodiment of the configurable processing and storage systems described above. A combination of compute-only blades and offload blades suited for the image processing, perhaps with deep learning on offload-FPGA or offload-custom blade(s) could take in the firehose of large data from all of the digital cameras, and produce the firehose of small data. All of the small data could then be stored by storage nodes, operating with storage units in whichever combination of types of storage blades best handles the data flow. This is an example of storage and function acceleration and integration. Depending on external communication needs with the cloud, and external processing in the cloud, and depending on reliability of network connections and cloud resources, the system could be sized for storage and compute management with bursty workloads and variable conductivity reliability. Also, depending on other inventory management aspects, the system could be configured for scheduling and resource management in a hybrid edge/cloud environment.

The storage systems described above may alone, or in combination with other computing resources, serves as a network edge platform that combines compute resources, storage resources, networking resources, cloud technologies and network virtualization technologies, and so on. As part of the network, the edge may take on characteristics similar to other network facilities, from the customer premise and backhaul aggregation facilities to Points of Presence (PoPs) and regional data centers. Readers will appreciate that network workloads, such as Virtual Network Functions (VNFs) and others, will reside on the network edge platform. Enabled by a combination of containers and virtual machines, the network edge platform may rely on controllers and schedulers that are no longer geographically co-located with the data processing resources. The functions, as microservices, may split into control planes, user and data planes, or even state machines, allowing for independent optimization and scaling techniques to be applied. Such user and data planes may be enabled through increased accelerators, both those residing in server platforms, such as FPGAs and Smart NICs, and through SDN-enabled merchant silicon and programmable ASICs.

The storage systems described above may also be optimized for use in big data analytics. Big data analytics may be generally described as the process of examining large and varied data sets to uncover hidden patterns, unknown correlations, market trends, customer preferences and other useful information that can help organizations make more-informed business decisions. Big data analytics applications enable data scientists, predictive modelers, statisticians and other analytics professionals to analyze growing volumes of structured transaction data, plus other forms of data that are often left untapped by conventional business intelligence (BI) and analytics programs. As part of that process, semi-structured and unstructured data such as, for example, internet clickstream data, web server logs, social media content, text from customer emails and survey responses, mobile-phone call-detail records, IoT sensor data, and other data may be converted to a structured form. Big data analytics is a form of advanced analytics, which involves complex applications with elements such as predictive models, statistical algorithms and what-if analyses powered by high-performance analytics systems.

The storage systems described above may also support (including implementing as a system interface) applications that perform tasks in response to human speech. For example, the storage systems may support the execution of intelligent personal assistant applications such as, for example, Amazon's Alexa, Apple Siri, Google Voice, Samsung Bixby, Microsoft Cortana, and others. While the examples described in the previous sentence make use of voice as input, the storage systems described above may also support chatbots, talkbots, chatterbots, or artificial conversational entities or other applications that are configured to conduct a conversation via auditory or textual methods. Likewise, the storage system may actually execute such an application to enable a user such as a system administrator to interact with the storage system via speech. Such applications are generally capable of voice interaction, music playback, making to-do lists, setting alarms, streaming podcasts, playing audiobooks, and providing weather, traffic, and other real time information, such as news, although in embodiments in accordance with the present disclosure, such applications may be utilized as interfaces to various system management operations.

The storage systems described above may also implement AI platforms for delivering on the vision of self-driving storage. Such AI platforms may be configured to deliver global predictive intelligence by collecting and analyzing large amounts of storage system telemetry data points to enable effortless management, analytics and support. In fact, such storage systems may be capable of predicting both capacity and performance, as well as generating intelligent advice on workload deployment, interaction and optimization. Such AI platforms may be configured to scan all incoming storage system telemetry data against a library of issue fingerprints to predict and resolve incidents in real-time, before they impact customer environments, and captures hundreds of variables related to performance that are used to forecast performance load.

The storage systems described above may support the serialized or simultaneous execution artificial intelligence applications, machine learning applications, data analytics applications, data transformations, and other tasks that collectively may form an AI ladder. Such an AI ladder may effectively be formed by combining such elements to form a complete data science pipeline, where exist dependencies between elements of the AI ladder. For example, AI may require that some form of machine learning has taken place, machine learning may require that some form of analytics has taken place, analytics may require that some form of data and information architecting has taken place, and so on. As such, each element may be viewed as a rung in an AI ladder that collectively can form a complete and sophisticated AI solution.

The storage systems described above may also, either alone or in combination with other computing environments, be used to deliver an AI everywhere experience where AI permeates wide and expansive aspects of business and life. For example, AI may play an important role in the delivery of deep learning solutions, deep reinforcement learning solutions, artificial general intelligence solutions, autonomous vehicles, cognitive computing solutions, commercial UAVs or drones, conversational user interfaces, enterprise taxonomies, ontology management solutions, machine learning solutions, smart dust, smart robots, smart workplaces, and many others. The storage systems described above may also, either alone or in combination with other computing environments, be used to deliver a wide range of transparently immersive experiences where technology can introduce transparency between people, businesses, and things. Such transparently immersive experiences may be delivered as augmented reality technologies, connected homes, virtual reality technologies, brain-computer interfaces, human augmentation technologies, nanotube electronics, volumetric displays, 4D printing technologies, or others. The storage systems described above may also, either alone or in combination with other computing environments, be used to support a wide variety of digital platforms. Such digital platforms can include, for example, 5G wireless systems and platforms, digital twin platforms, edge computing platforms, IoT platforms, quantum computing platforms, serverless PaaS, software-defined security, neuromorphic computing platforms, and so on.

The storage systems described above may also be part of a multi-cloud environment in which multiple cloud computing and storage services are deployed in a single heterogeneous architecture. In order to facilitate the operation of such a multi-cloud environment, DevOps tools may be deployed to enable orchestration across clouds. Likewise, continuous development and continuous integration tools may be deployed to standardize processes around continuous integration and delivery, new feature rollout and provisioning cloud workloads. By standardizing these processes, a multi-cloud strategy may be implemented that enables the utilization of the best provider for each workload. Furthermore, application monitoring and visibility tools may be deployed to move application workloads around different clouds, identify performance issues, and perform other tasks. In addition, security and compliance tools may be deployed for to ensure compliance with security requirements, government regulations, and so on. Such a multi-cloud environment may also include tools for application delivery and smart workload management to ensure efficient application delivery and help direct workloads across the distributed and heterogeneous infrastructure, as well as tools that ease the deployment and maintenance of packaged and custom applications in the cloud and enable portability amongst clouds. The multi-cloud environment may similarly include tools for data portability.

The storage systems described above may be used as a part of a platform to enable the use of crypto-anchors that may be used to authenticate a product's origins and contents to ensure that it matches a blockchain record associated with the product. Such crypto-anchors may take many forms including, for example, as edible ink, as a mobile sensor, as a microchip, and others. Similarly, as part of a suite of tools to secure data stored on the storage system, the storage systems described above may implement various encryption technologies and schemes, including lattice cryptography. Lattice cryptography can involve constructions of cryptographic primitives that involve lattices, either in the construction itself or in the security proof. Unlike public-key schemes such as the RSA, Diffie-Hellman or Elliptic-Curve cryptosystems, which are easily attacked by a quantum computer, some lattice-based constructions appear to be resistant to attack by both classical and quantum computers.

A quantum computer is a device that performs quantum computing. Quantum computing is computing using quantum-mechanical phenomena, such as superposition and entanglement. Quantum computers differ from traditional computers that are based on transistors, as such traditional computers require that data be encoded into binary digits (bits), each of which is always in one of two definite states (0 or 1). In contrast to traditional computers, quantum computers use quantum bits, which can be in superpositions of states. A quantum computer maintains a sequence of qubits, where a single qubit can represent a one, a zero, or any quantum superposition of those two qubit states. A pair of qubits can be in any quantum superposition of 4 states, and three qubits in any superposition of 8 states. A quantum computer with n qubits can generally be in an arbitrary superposition of up to $2^n$ different states simultaneously, whereas a traditional computer can only be in one of these states at any one time. A quantum Turing machine is a theoretical model of such a computer.

Figure 4:
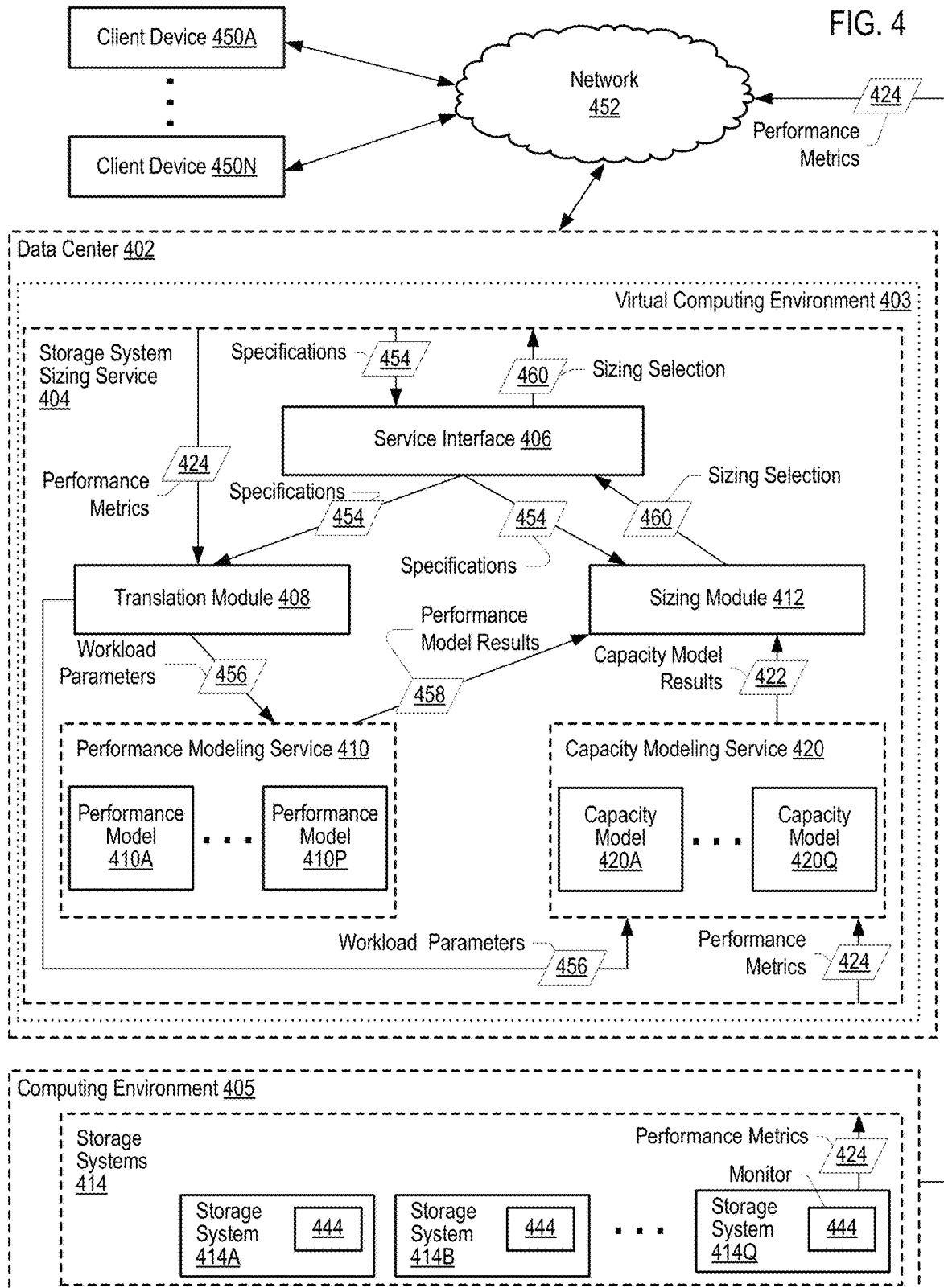
FIG. 4 sets forth a diagram of a storage system sizing service according to some embodiments of the present disclosure.

For further explanation, FIG. 4 sets forth a diagram of a storage system sizing service 404 in accordance with some embodiments of the present disclosure. FIG. 4 further depicts a data center (402) that provides a virtual computing environment (403) within which a virtual machine may implement the storage array sizing service (404) accessible to multiple clients, including client devices (450A-450N), over a network (452). In this example, the storage systems (414) depicted in FIG. 4 may include individual storage systems (414A-414Q) that are similar to the storage systems described above with reference to FIGS. 1A-1D and FIGS. 2A-2G as the storage systems (414A-414Q) may include some or all of the components described above.

A storage system sizing service (404)—given one or more specifications for storage system capacity and/or performance requirements—determines one or more storage system configurations that meet or exceed the capacity and/or performance requirements. In other words, the one or more specifications may specify either storage system capacity requirements exclusively, performance requirements exclusively, or a combination of storage system capacity requirements and performance requirements. For example, the storage system sizing service (404) may receive requested capacity requirements in addition to specifications, such as requests for storage services, that may have an effect on capacity usage, and determine a storage system configuration with raw, actual, or configured physical capacity that satisfies the requested capacity requirements. Similarly, the storage system sizing service (404) may receive requested performance requirements in addition to specifications that may have an effect on performance, such as requests for storage services or levels of service, and then determine a storage system configuration with raw, actual, or configured performance parameters that satisfies the requested performance requirement. In this example, given determinations for storage systems that satisfy requested capacity requirements, and storage systems that satisfy requested performance requirements, the storage system sizing service (404) may determine one or more storage system configurations that satisfy both the determined capacity requirements and the determined performance requirements.

In the following examples, the storage system sizing service implements a performance modeling service (410) to determine one or more storage systems that satisfy performance requirements, and implements a capacity modeling service (420) that determines one or more storage systems that satisfy capacity requirements. Given results from one or both of the performance modeling service (410) and the capacity modeling service (420), the storage system sizing service (404) determines a selection of one or more storage systems that satisfy all specifications (454) for requirements.

In this way, the storage system sizing service (404) determines configurations for one or more storage systems to satisfy requested capacity and/or performance requirements such that capacity and performance overhead for any attendant data storage services does not cause a particular storage system configuration to fail to satisfy the requested capacity and/or performance requirements. In some cases, the attendant data storage services may be requested directly, such as a request for snapshots, or replication, or some other service, or the storage system sizing service (404) may determine the data storage services that may be intrinsic or inherent to a given storage system. In short, as an example, if requested storage capacity is for C TB, and requested performance includes a minimum of P IOPS, a storage system configuration that provides no more than C TB and P IOPS would fail to satisfy C and P if any storage services are also requested at least in part because implementation of storage services may reduce C and P provided the storage system configuration. In short, the storage system sizing service (404) determines models for capacity and performance that account or adjust for storage system overhead in providing a requested capacity and/or performance.

As one example, a storage system sizing service (404) may receive a request for determining a storage system configuration to provide 100 TB of storage capacity and 100K IOPS. In this simplified example, the storage system sizing service (404) may also receive a request to perform snapshots and data replication, and receive a specification for a type of dataset, which may correspond to a data reduction of 5:1.

Continuing this example, with regard to capacity modeling, to determine a storage capacity specification for a storage system configuration, the storage system sizing service may: determine, based on the data reduction rate of 5:1, that 20 TB are needed, resulting in a physical capacity requirement of 20 TB; determine that, based on snapshot specifications, that 10 TB are needed, resulting in a physical capacity requirement of 30 TB; determine, based on data replication specifications, that 5 TB are needed, resulting in a physical capacity requirement of 35 TB.

Continuing this example, with regard to performance modeling, to determine a performance specification for a storage system configuration, the storage system sizing service may: determine, based on snapshot specifications, that IOPS performance may be reduced by 10%, resulting in an IOPS performance requirement of a storage system configuration of at least 110K IOPS; determine that, based on data replication specifications, that IOPS performance may be reduced by 5%, resulting in an IOPS performance requirement of a storage system configuration of at least 115K IOPS.

In this way, in this example, given these results from the capacity modeling and performance modeling, the storage system sizing service (404) may select, or determine, that a storage system configuration to satisfy the requested capacity and performance requirements should provide at least 35 TB and 115K IOPS. Further, because available storage system configurations may not match these determined capacity and performance values exactly, the storage system sizing service (404) may determine a best, or minimally configured one or more storage systems—from among multiple, differently configured storage systems—that provide at least the determined capacity and performance requirements of 35 TB and 115K IOPS.

While this example focuses on capacity and performance requirements, in some examples, a user may specify requirements for security features such as levels or types of encryption, hardware encryption, secure memory, and/or types of authentication or authentication techniques, and the storage system sizing service (404) may select one or more storage systems that satisfy capacity requirements, performance requirements, and security requirements.

In this way, a storage system configuration determined by the storage system sizing service (404) will satisfy capacity and/or performance requirements, and in some cases security requirements, while simultaneously providing any data storage services that may also be requested. Described below are additional example embodiments for the storage system sizing service (404).

With reference to FIG. 4, a storage system sizing service (404) may include a service interface (406), a translation module (408), a performance modeling service (410), a sizing module (412), and a capacity modeling service (420). In some examples, the storage system sizing service (404) may be in communication with one or more storage systems (414) to receive performance metrics (424) corresponding to different configurations of storage systems. The performance metrics (424) may be usable, for example, in generating a growth model and/or performance model for different storage system configurations and/or for determining a configuration of storage systems to satisfy requested capacity and/or performance requirements.

The storage systems (414) may be implemented within a computing environment (405), where the computing environment (405) may be a local, on-premises computing environment, a remote computing environment within a data center, or a combination of local and remote computing resources. Further, the performance metrics (424) may be gathered by one or more monitors (444) implemented within a given storage system (414A-414Q) to collect metrics describing storage system usage, IOPS, configuration information and/or changes, and generally any usage or performance measurements regarding the storage system. The one or more monitors (444) may transmit performance metrics (424) to a storage system sizing service (404) periodically, aperiodically, in response to system events, or in response to a request for the performance metrics (424).

In the example computing environment depicted in FIG. 4, the storage system sizing service (404) is implemented within a virtual computing environment (403) provided by a data center (402); however, in other examples, the storage system sizing service (404) may be implemented within one or more local servers that are located on the premises of a user. Similarly, the storage system sizing service (404) may be implemented within a hybrid computing environment, or bare metal systems provided by a data center or cloud computing provider.

In this example, client devices (450A-450N) that communicate with the storage system sizing service (404) may be any computing device, including desktop computers, mobile computing devices such as cellular telephones or tablets, or intelligent appliances such as content streaming devices, smart televisions, or other Internet-enabled computer devices capable of requesting or procuring storage system services.

A service interface (406) for the storage system sizing service (404) may provide a plurality of access points to simultaneously or in parallel, over a network (452), provide multiple user interfaces and receive multiple user inputs. For example, one or more users at one or more computing devices may access the service interface (406) through a webpage or an application for a mobile device, where a user may provide specifications (454) characterizing user requirements or user preferences for configuring one or more storage systems. Given the specifications (454), the storage system sizing service (404) may then use the specifications (454) as a basis for generating performance models or capacity models and as a basis for a selection (460) of one or more storage systems that satisfy the user specifications (454). Further, given the selection (460) of one or more storage systems that satisfy the user specifications (454), the selection (460) may be provided to a user or requesting process through the service interface (406).

A translation module (408) for storage system sizing service (404) may receive specifications (454) from a user that indicate types of service or specific hardware characteristics requested, or that indicate parameters from which specific hardware characteristics may be inferred. As one example, a user may provide specific hardware or storage system specifications (454) that describe, among other things, expected I/O operation sizes for reads or writes, expected types of workloads, data reduction ratios expected for an expected type of workload, requested IOPS, current storage usage metrics, or other parameters that are descriptive of one or more storage system characteristics.

As another example, a storage system sizing service (404) may provide a service to one or more remote or local clients such that a client may request a storage solution, and where the request may be characterized at a level of abstraction that includes one or more specifications that are not directly descriptive of a hardware parameter or a technical specification. For example, a client may request a sizing solution through a user interface provided by the service interface (406), where the user interface allows a client to select or specify one or more specifications such as a requested level of service, a type of service, or financial restrictions or budgetary constraints. In this example, a request may include each of the one or more specifications provided by a client, and where the translation module (408) may infer or correlate a user specification with a storage system specification.

In some examples, the input specifications (454) received from a user, or computer process or software application, as part of a request to receive a selected one or more storage systems that would provide storage capacity and storage system performance to meet the demands or requirements provided by a user may include an indication of a minimum quantity of storage capacity, specific performance characteristics, an estimated growth rate for data storage, whether or not backups are requested and if so, an indication of how often to perform snapshots, whether or not replication will be expected, or other indications for different aspects usable to determine a storage system capacity sufficient to meet or exceed system capacity and performance requirements provided by the user.

Generally, while a user may have a sense for a quantity of storage necessary, this quantity of storage may be a value that does not factor in system overhead that is unavoidable. For example, a user may know that, for a given app, the data storage needs are 50 TB (terabytes), but for a storage system to store 50 TB such that I/O operations, or other data storage management operations are efficient, or satisfy some performance requirements, the storage system capacity may need to be some given quantity larger than 50 TB. This given quantity larger may account for metadata tagging, or other types of management data that is stored to manage the user data, and this given quantity may be one of the values determined by the storage system sizing service (404). Further with regard to this example, for an app that requires 50 TB of storage, with a read/write ratio of 60:40, a data reduction ration of 5:1, and an average I/O size of 32 KB, the storage system sizing service (404) may determine that one or more storage systems that provide (50 TB+X TB) of storage is a configuration that would satisfy the user requirements for capacity and performance, while allowing for some leeway for growth for an acceptable window of time before the capacity and performance do not meet the user requirements, where X is determined by the storage system sizing service (404). In some examples, the determined storage system may be configured with less storage capacity that is requested due to data reduction, or other storage system features allowing the storage system to provide an effective address space, or storage capacity, that satisfies specified requirements.

Further, in some cases, the specifications (454) provided may include, in addition to specifications that are not hardware based, technical specifications such as maximum or minimum numbers of input/output operations per unit of time, an indication of a maximum or minimum quantity of storage, an indication of a type of storage device such as a solid state drive, a mechanical disk, or some other type or combination of hardware storage types.

In other examples, a client may provide specifications (454) that specify times of a day, week, or time of year, when more or less traffic or demand is to be expected or requested. In other example, a client may provide specifications (454) that specify types of data that may be typically stored or written, such as structured, unstructured, text, binary, photographs, video, audio, or some other characterization of the type of data to be processed. In other example, the client may provide specifications (454) that specify indications such as how available the service is to be, such as "highly available," "generally available," or some other indication of tolerance of unavailability. In other examples, a user may simply provide, instead of or in addition to a characterization, a sample data set of previous data stored. In other examples, a client may specify a length of time data may be stored, or how often data is to be accessed.

In some examples, a requested level of service may be "fastest available," "hardly any response lag," "sometimes a response lag is acceptable," or "least expensive," among others. In some examples, a type of service may be an indication of an online store, a database, an application ("app"), a gaming platform, a social network, or any other type of online or network service. In some examples, a financial restriction or budgetary constraint may be a specific monetary amount, a range of values, or a more abstract indication such as "best available."

Continuing with this example, given one or more specifications (454) received from a client that characterize user requirements, the service interface (406) of a storage system sizing service (404) may then provide the specifications (454) to the translation module (408) to translate the one or more specifications (454) into workload parameters (456), where the specifications (454), as described above, may include specific storage device or storage system specifications or abstract specifications as described above such as "fastest available," and translate the specifications (454) into workload parameters (456) that may be used to build and/or execute one or more performance models (410A-410P) of the performance modeling service (410) or to build one or more capacity models (420A-420Q) of the capacity modeling service (420). In some cases, the specifications (454) may include specifications that would not be acceptable input to one or more of the performance models (410A-410P), but where the translated result or the translation of the specifications (454), which are depicted as workload parameters (456) in this example, would be acceptable input to the performance modeling service (410) or one or more performance models (410A-410P), or to the capacity modeling service (420) or one or more capacity models (420A-420Q).

Continuing with this example, the translation module (408) may provide workload parameters (456) to the performance modeling service (410) or the capacity modeling service (420), where in response, the performance modeling service (410) may build one or more performance models or run one or more simulations or runs of the input on one or more of the performance models (410A-410P), and where the capacity modeling service (420) may build or execute one or more capacity models or run one or more simulations or runs of the input on one or more capacity models (420A-420Q).

In this example, the translation module (408) may determine that an abstract user indication such as an indication of expected data types to be video into a workload or hardware parameter indicating a reduction ratio for the data. In other examples, the translation module (408) may determine that a service type requested by a user, for example based on a requested database service or gaming service or some other service type, a corresponding ratio of reads and writes, or a corresponding expected input/output load. Similarly, the translation module (408) may interpret combinations of user indications within the specifications (454) into a single workload or hardware parameter or into multiple workload or hardware parameters. In this example, the performance modeling service (410) may then provide the performance modeling results (458) to a sizing module (412) for generating a selection of one or more storage systems that, when brought online, satisfy within a certain threshold, the user requirements or requested behavior or performance.

A performance modeling service (410) may include one or more performance models (410A-410P). Further, each of the performance models (410A-410P) may be models generated or constructed based different combinations of inputs such as: requested storage services, one or more data sets, usage scenarios, and workload parameters that may be provided to different combinations of and types of data storage systems such as: storage systems or arrays using different quantities of storage devices, different types of storage devices, virtualized storage systems, non-virtualized storage arrays, or combinations of these data storage systems. In some examples, the performance models may include a growth model, a snapshot model, a replication model, an asynchronous replication model, a synchronous replication model, including other models corresponding to different types of storage services or performance requirements in the specifications (454).

In this way, the performance modeling service (410) may generate, from the output of the one or more performance models (410A-410P) operating on the workload parameters (456), one or more performance modeling results (458) to provide to a sizing module (412) that uses the performance modeling results (458) to determine a selection of one or more storage system configurations that satisfy requested specifications (454)

The capacity modeling service (420) may include capacity models (420A-420Q). In some examples, the capacity models may include a growth model, a snapshot model, a replication model, an asynchronous replication model, a synchronous replication model, including other models corresponding to different types of storage services or storage requirements in the specifications (454). In this way, for a given specified service, a specific capacity model may be used to determine how to adjust or modify a storage capacity configuration. For example, a growth model may generate growth model results (422), where the growth model results may be used by the capacity modeling service to determine a capacity that satisfies requested specifications (454). In this way, the growth model results indicate that while, at current expected workloads, a given selection of one or more storage systems is within a capacity threshold value of a maximum, that within a given period of time, the capacity threshold is likely to be exceeded. For example, the capacity threshold may be 80%, or some other value, and the given period of time may be one month, six months, or some other period of time within which it would be unacceptable, or too expensive (as measured by a threshold quantity), or too resource intensive, to migrate onto another set of one or more storage systems. In this way, the capacity modeling service (420) may use a growth rate in determining which one or more storage systems satisfy requested specifications (454). Similarly, other capacity models may be used by the capacity modeling service (420) to determine which one or more storage systems satisfy requested specifications (454).

In this example, the growth model results may be based a growth rate based at least upon performance metrics (424) received from one or more storage systems that are currently implementing similar workloads to the workloads expected on the storage systems of a sizing selection (460). In some examples, the growth model may also receive workload parameters (456) from the translation module (408) for use in generating a growth rate. In some cases, the growth model may apply machine learning techniques to adjust the growth rates based on each of the inputs over time. While in this example, the growth model receives metrics from the storage systems (414), which may or may not be associated with the user providing the specifications (454), in other examples, the growth model may communicate with a cloud-based storage system management service that provides metrics for storage systems operating similar workloads to the workloads provided by the user specifications (454). In some examples, the metrics may include storage capacity metrics including storage usage and/or growth corresponding to one or more workloads, include performance metrics, including changes in performance, corresponding to one or more workloads, or include both storage capacity usage and performance metrics corresponding to one or more workloads.

A sizing module (412) may use modeling results from one or both of the capacity modeling service (420) or the performance modeling service (410) to determine a selection of one or more storage systems that satisfy requirements (454).

For example, given performance modeling results (458), the sizing module (412) may correspond or compare one or more of the performance modeling results (458) to one or more performance capabilities of an available selection of storage systems, where the available storage systems may be provided by one or more manufacturers of storage systems. In this example, based a particular performance model result, the sizing module (412) may determine that a single storage system or a combination of storage systems from among the available storage systems may provide features or performance that correspond to one of the higher values of a particular metric in the particular performance model result, while also not violating a user requirement as indicated within the specifications (454).

Similarly, given capacity modeling results (422), the sizing module (412) may correspond or compare one or more capacity modeling results (422) to one or more storage capacity configurations of an available selection of storage systems. In this example, based on a particular capacity model result, the sizing module (412) may determine that a single or a combination of storage systems from among the available storage systems may provide features or storage capacity that correspond to one of the higher values of a particular metric in the particular capacity modeling result, while also not violating a user requirement as indicated within the specifications (454).

The performance modeling results (458) may be the results of applying one or more adjusting factors to determine a performance capacity requirement or requirements. For example, the performance modeling results (458) may be based on parameters for various combinations of workload parameters that may be closest to a specification parameter—where there may be $P_1$ different options for possible workload parameters for read/write ratios, $P_2$ different options for workload parameters for possible data reduction ratios, $P_3$ different options for workload parameters for possible I/O sizes, and so on until $P_n$ different options for workload parameter n for some given workload parameter type. Such a selection of a subset of different workload parameter combinations would result in $P_1 \times P_2 \times P_3 \times \ldots \times P_n$ different models through which calculations may be performed. In this way, while the performance modeling service (410) may not calculate performance modeling results based exactly on the specifications (454), the available performance model(s) used may be a best fit for the specifications (454).

In this way, given performance model results (458) from the performance modeling service (410), the sizing module (412) may generate or select a set of one or more storage systems from among the storage systems available, where the set of one or more storage systems conforms with specifications (454), and where the set of one or more storage systems corresponds to one or more of the highest performance model metrics within performance model results (458). Similarly, as discussed above, given capacity model results (422) from the capacity modeling service (420), the sizing module (412) may generate or select a set of one or more storage systems from among available storage systems, where the set of one or more storage systems conforms with specifications (454). In this way, configurations settings for the selected one or more data storage systems may be based at least upon one or more of: the performance model results (458), the capacity model results (422), specifications (454), workload parameters (456), available storage systems (414), or a product line of storage systems that are currently being promoted.

Concluding this example the set of one or more storage systems selected by the sizing module (412) may be included in a sizing selection (460) that is provided to a user via the service interface (406).

Further, while in the previous example the storage system sizing service (404) may select one or more storage systems that are not yet deployed, in other examples, a user may already have one or more storage systems in use—where the user may provide specifications for current or expected workloads, and provide these specifications to the storage system sizing service (404) to receive a sizing selection (460) that may be used to determine whether or not the existing one or more storage systems in use are sufficient to meet the current or expected workloads. In other examples, the specifications (454) may also indicate that a response is requested to evaluate whether a current storage system meets or will continue to meet, or for how long the storage system will continue to meet, a current or expected workload—where the specifications may indicate the performance or capacity configurations of one or more storage systems.

Also depicted within the computing environment of FIG. 4 is a storage system (414) that may include one or more storage systems or arrays (414A-414Q), where the storage systems (414A-414Q) may be similarly or differently configured storage systems characterized by one or more hardware parameters, such as storage capacity, response times, read times, write times, reliability characteristics, types of memory, among other storage system parameters. The storage systems (414A-414Q) may or may not be associated with a user providing specifications (454).

Further with regard to the performance modeling service (410) and capacity modeling service (420), and to generating performance models and capacity models, the performance modeling service (410) and capacity modeling service (420) may generate performance models or capacity models with characteristics that are representative of a subset of combinations of workload parameters and storage system configurations. By generating performance or capacity models for some, but not all, possible combinations of workload parameters, the performance modeling service (410) and capacity modeling service (420) may balance computational exhaustiveness with resource expenditure in calculating capacity utilization according to workload parameters. Further, by generating performance models and capacity models for a likely range of values among a spectrum of possible values for each different parameter among the workload parameters, the coverage of possible combinations of workload parameters with storage system configurations is not likely to exclude many valuable combinations of storage system configurations.

As discussed above, the storage system sizing service (404) may be used when a user is initially making a determination for what type and configuration of storage system or storage systems are appropriate or sufficient for a given expected workload, in some examples, the storage system sizing service (404) may be used for a working, currently operating storage system. For example, the storage system sizing tool may take as input specifications (454) that are representative of a current configuration of a deployed storage system, and sizing selection (460) that is generated by the sizing module (412) may provide the user, or administrator in communication with the user, with capacity utilization information that may be used to determine whether or not the currently deployed storage system should be upgraded, or to determine whether or not the currently deployed storage system is operating beyond a recommended capacity utilization, or to determine whether or not the currently deployed storage system is an appropriate, efficient, or optimal fit for the current workload.

Figure 6:
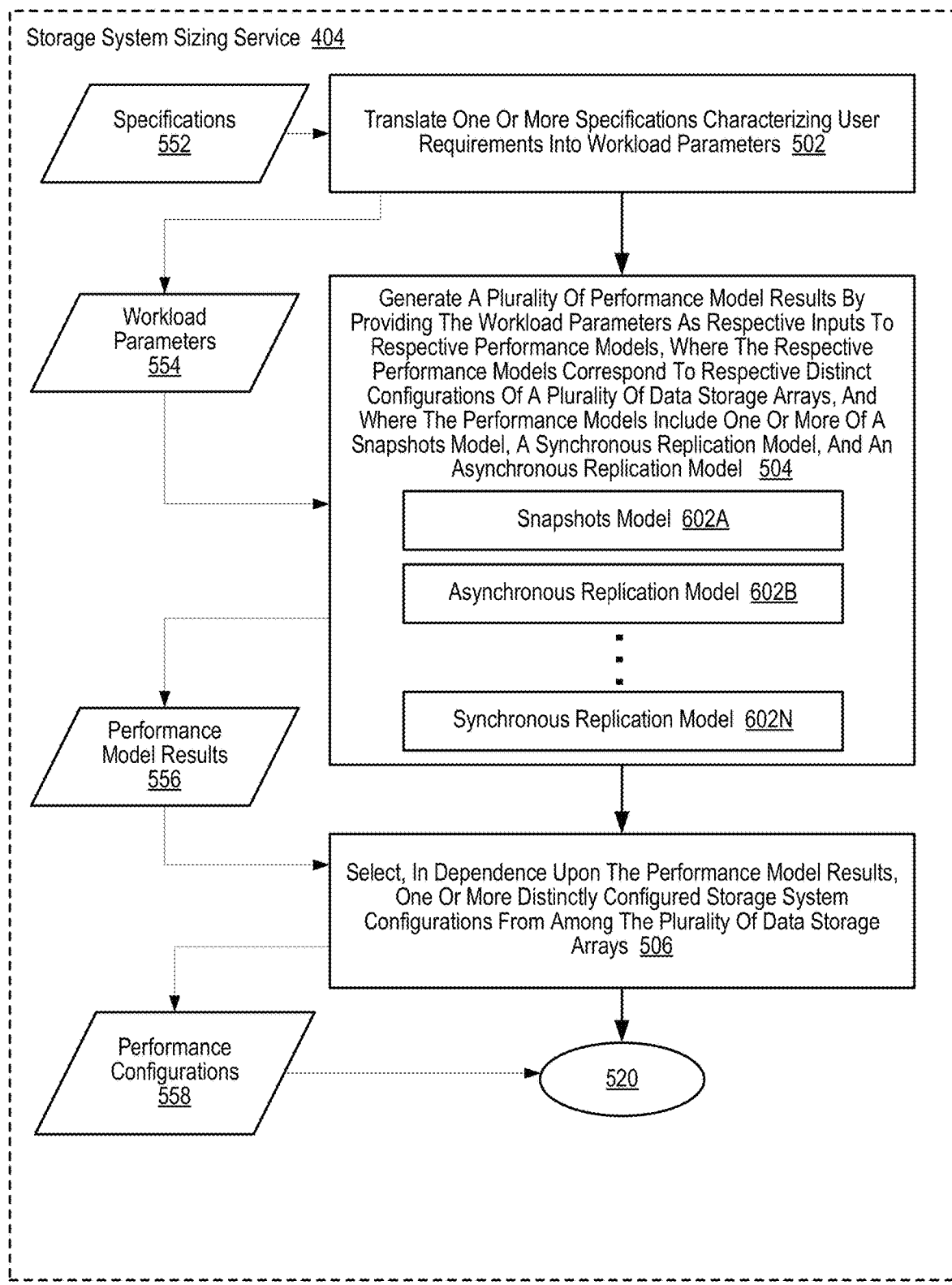
FIG. 6 sets forth a flow chart illustrating an additional example method of a storage system sizing service according to some embodiments of the present disclosure.
Figure 7:
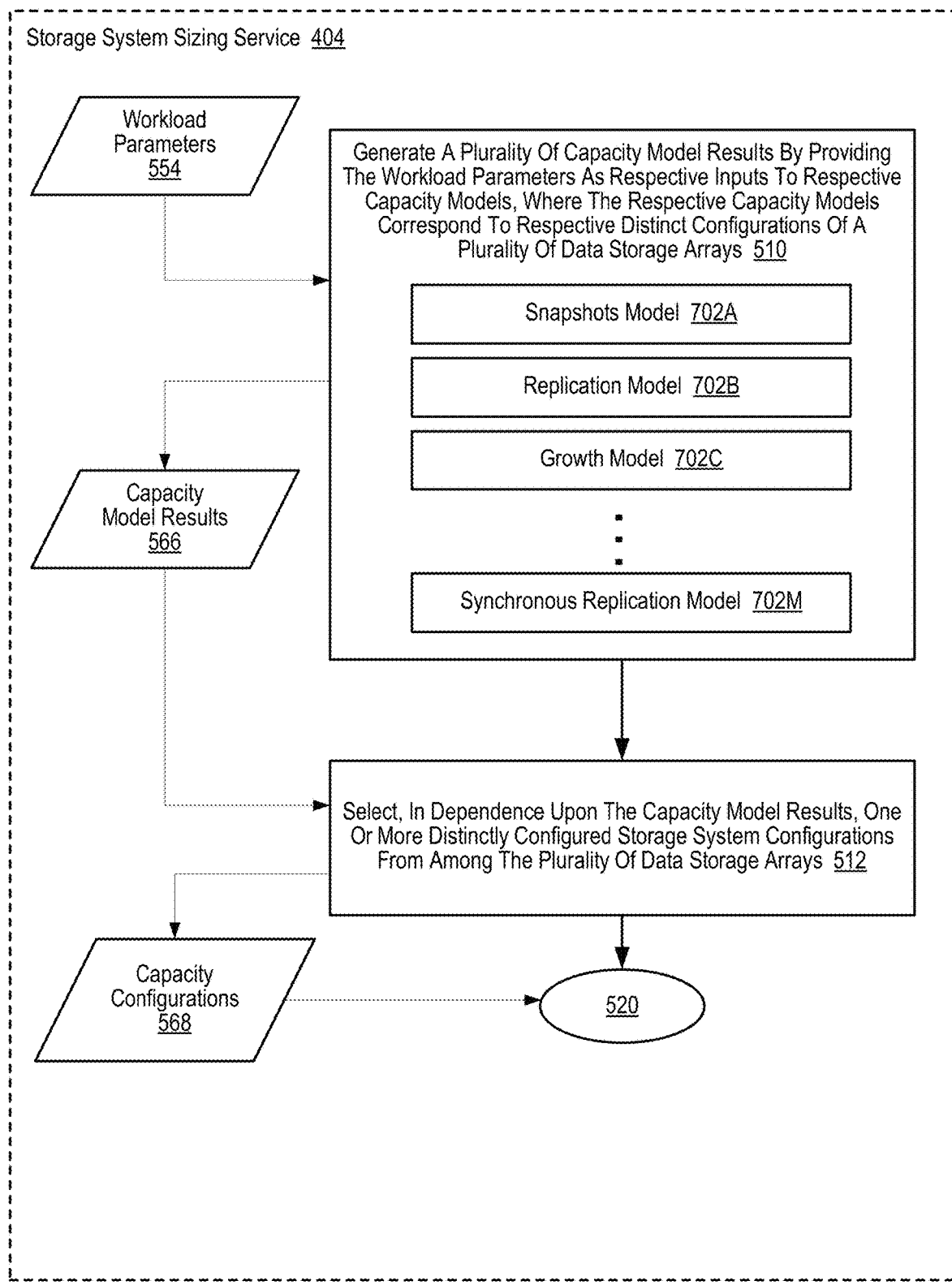
FIG. 7 sets forth a flow chart illustrating an additional example method of a storage system sizing service according to some embodiments of the present disclosure.

Specific example input specifications and sizing calculations are described in greater detail below with regard to FIGS. 5A-7. As a brief overview, FIG. 5A describes steps executed by the performance modeling service (410) in selecting performance-based configurations of storage systems, FIG. 5B describes steps executed by the capacity modeling service (420) in selecting a capacity-based configurations of storage systems, and FIG. 5C describes steps executed by the sizing module (412) in selecting one or more storage system configurations that satisfy specifications (454) for both performance and capacity. FIG. 6 provides a depiction of example performance models, and FIG. 7 provides a depiction of example capacity models.

Figure 5A:
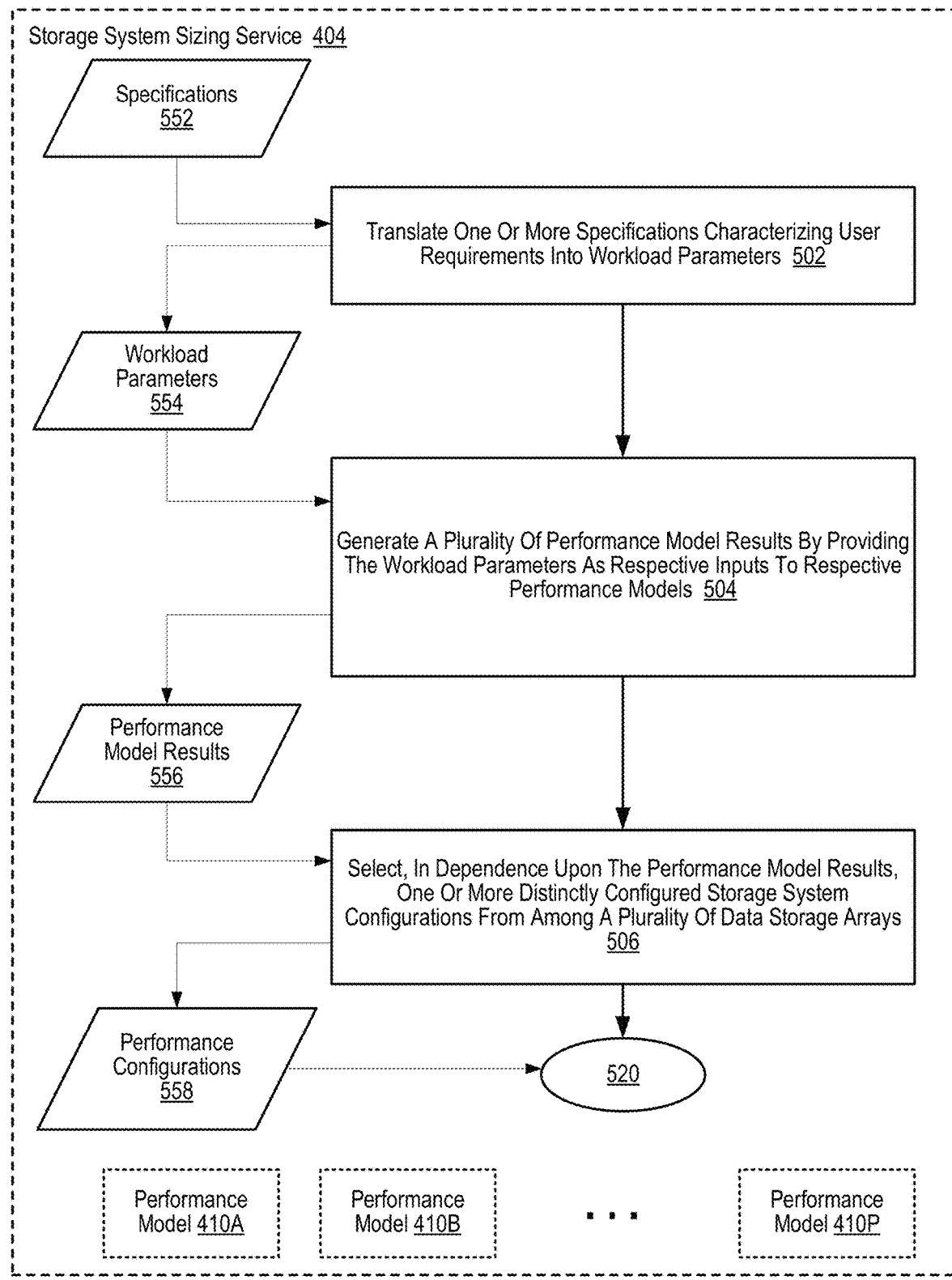
FIG. 5A sets forth a flow chart illustrating an additional example method of a storage system sizing service according to some embodiments of the present disclosure.

For further explanation, FIG. 5A sets forth a flow chart illustrating an example method of storage system sizing in a storage system sizing service (404) according to some embodiments of the present disclosure. Although depicted in less detail, the storage system sizing service (404) depicted in FIG. 5A may be similar to the systems described above with reference to FIG. 4. In other words, the storage system sizing service (404) depicted in FIG. 5A may include the same, fewer, or additional components as the storage system sizing service (404) described above.

The example method depicted in FIG. 5A includes translating (502) one or more input specifications (552) characterizing user requirements into workload parameters (554), generating (504) a plurality of performance modeling results (556) by providing the workload parameters (554) as respective inputs to respective performance models, where the respective performance models correspond to respective distinct configurations of a plurality of data storage systems, and selecting (506), in dependence upon at least the performance model results (556), one or more distinctly configured data storage systems, depicted as performance configurations (558), from the plurality of data storage systems.

In different examples, the functionality depicted within the flowchart of FIG. 5A, in addition to other functionality, may be distributed in different ways among the various components of the storage system sizing service (404).

Translating (502) the one or more specifications (552) characterizing requirements into workload parameters (554) may be carried out by determining, for each of the specifications (552), one or more corresponding workload parameters, that are suitable as input to one or more performance models or usable to generate specifications for a performance model. For example, determining a correspondence between specifications and performance model parameters may include corresponding a service type requested by a user, for example based on a requested database service or gaming service or some other service type, to a ratio of reads and writes, or to an expected input/output load, snapshots, asynchronous replication, synchronous replication, among others. Such correspondences may be stored or configured. In another example, as described above with reference to FIG. 4, a translation module (408) may carry out translating (502) the one or more specifications (552) into workload parameters (554).

Further, the translation module (408) may also generate workload parameters based on the input specifications (552). For example, a user may provide an input specification that characterizes data as video data, or some other type of data, and the translation module may determine that the video data may be expected to be compressed or deduplicated at a ratio of 5:1, and provide the deduplication ratio as a workload parameter (554). Similarly, for other types of data the translation module (408) may determine different workload characteristics, including different deduplication, compression, or other data reduction ratios, read size averages, write size averages, and read/write ratios, among other workload parameters.

Generating (504) the plurality of performance modeling results (556) may be carried out by the storage system sizing service (404) using the workload parameters (554) to generate an input that corresponds to a particular one or more performance models (410A-410P). In this example, the output of the one or more performance models (410A-410P) operating on the workload parameters (554) is used to generate one or more performance modeling results (556) that may be combined or used individually, depending on a particular combination of workload parameters. In other words, as described above with reference to FIG. 4, a performance modeling service (410) may carry out generating (504) the plurality of performance modeling results (556).

As one example, given workload parameters that include indications for a minimum IOPS or some other performance requirement, a data reduction ratio, a R/W ratio, and a read/write size, the storage system sizing service (404) may generate or use M modeling benchmarks, where M= $P_1 \times P_2 \times \ldots \times P_n$, and where $P_1$ may represent a number of variations for a data reduction ratio, $P_2$ may represent a number of variations for R/W ratios, and $P_n$ may represent a number of variations for read/write sizes. In this example, $P_1$ may be three (3), and include variations of 1:1, 5:1, 10:1; $P_2$ may be two (2), and include variations of 8 KB and 32 KB; and $P_n$ may be three (3) and include variations of 1:1, 2:1, 1:2. However, in other examples, there may be additional workload parameters and/or additional variations for each given workload parameter. In other words, the number of modeling benchmarks M may vary in direct correlation to the number n of workload parameters P and to the number of variations i for each workload parameter selected from among all possible parameter combinations, where n and i may be arbitrarily defined.

To continue with this example, given the 18 modeling benchmarks, the storage system sizing tool (404) may select one of the modeling benchmarks based on the workload parameters, and apply one or more adjustment factors corresponding to each applicable performance model to generate performance model results (556). For example, given a workload performance parameter of 100K IOPS, a selection of storage services that include data reduction and a data reduction ratio of 5:1, and use of snapshots. Therefore, the performance models corresponding to the workload parameters that affect performance are a data reduction model and a snapshot model. Specifically, because data reduction incurs system overhead in terms of performance for implementing the data reduction, a data reduction factor for the data reduction model is applied to determine an adjustment to storage system IOPS that may be provided due to implementing data reduction. In this example, the data reduction factor may be 0.1, and in response to 100K IOPS being multiplied by a data reduction factor of 0.1, a cost of performance overhead is determined to be 100K IOPS× 0.1=10K IOPS. Consequently, in this example, for the data reduction model corresponding to a 5:1 data reduction ratio, after applying a corresponding data reduction factor to the workload capacity parameter of 100K IOPS, an adjusted performance requirement, P, is 110 IOPS. In different examples, for different data reduction ratios, there may be different corresponding data reduction factors to account for different amounts of performance overhead that may be incurred by corresponding levels of computational resources used in reaching a given data reduction ratio.

Continuing with this example, given the input specifications (552) specified that snapshots will be taken periodically for the stored data, then the storage system sizing service (404) may determine a corresponding snapshot factor for the corresponding snapshot model for the corresponding modeling benchmark. For example, if a user specifies a snapshot frequency of $Z_1$ minutes, then the storage system sizing service (404) may determine a snapshot factor S to be $S_1$, and for a snapshot frequency of $Z_2$, the storage system sizing service (404) may determine a snapshot factor S to be $S_2$, where the snapshot factor S may increase as the snapshot frequency increases. In this way, the current performance requirement of P=110K IOPS, after application of the data reduction factor, may be determined to be P=110K IOPS+ (110K IOPS×S)=115K IOPS. In general, for other examples, based on the read/write ratios, adjustment factors for reads and writes, in accordance with expected IOPS, may be calculated according to respective factors based on a read operation being less computationally or resource intensive than a write operation.

While in this example, for the sake of simplicity and not by way of limitation, only a single performance measure is considered, IOPS. However, in other examples, there may be other performance parameters to which each applicable performance model may be applied. For example, instead of IOPS as a whole, a performance parameter may specifically indicate a performance measure for writing, reading, or erasing, network bandwidth, or generally any other performance metric that may correspond to a storage system.

In this example, the performance model results (556) may include a range of performance values $\{P_1 \ldots P_n\}$, for each specified performance workload parameter, where in this example, given only IOPS, the range of performance values is $\{(P_1=115K \text{ IOPS})\}$. Further, given storage system performance for different storage system configurations, the storage system sizing service (404) may then base a determination of one or more storage systems that would meet or exceed each of the performance values, where the determination is described as the selecting (506) step below.

Selecting (506), in dependence upon at least the performance model results (556), one or more distinctly configured data storage systems, depicted as performance configurations (558), from a plurality of data storage systems may be carried out by determining that the performance model results (556) correspond to one or more of the capabilities of one or more or a combination of storage systems. For example, based a particular performance model result, $P_i$, of the performance model results (556), the storage system sizing service (404) may determine that a single storage system or a combination of storage systems of storage systems may provide features or performance that satisfies a performance specification after accounting for performance overhead incurred in implementing all selected storage services.

Further, in some examples, given a performance model value of $P_i$=115K IOPS, the storage system sizing service (404) may select a storage system or a combination of storage systems such that $P_i$ is no more than a threshold factor, T, of the IOPS performance of one or more storage systems. In other words, rather than selecting a storage system with a maximum IOPS performance, which would satisfy the performance model values determined by the performance model, the storage system sizing service may select a storage system that provides no more than the threshold factor of performance over the performance model value. In this particular example, T may be 0.1, or some other pre-defined threshold value, where the threshold value may be adjustable dynamically in response to an administrator, or in response to a machine learning algorithm determining that a different threshold factor (for example, based at least in part on performance metrics for similarly configured storage systems carrying similar workloads performing similarly with a different threshold value) would be more resource efficient or cost-effective. In this way, in this example, the storage system sizing service (404) may select a storage system that is configured with Z amount of performance, where Z is greater than or equal to $Pi+(P_i \times 7)$ =115K IOPS+(115K IOPS×0.1)=127K IOPS, or a storage system configuration that provides between 115K IOPS and 127K IOPS. In a more general example, similar determinations may be made for each performance model value $P_i$ among multiple performance model results $\{P_1 \ldots P_n\}$, depicted as performance model results (556).

In some examples, the available storage systems from which the storage system sizing service (404) selects the one or more storage systems may be based on product line offerings of one or more companies or vendors, combinations of product line offerings of multiple companies or vendors, customized storage system hardware, virtualized configurations for a storage system, or combinations of physical and virtual storage systems.

In this way, the selected one or more distinctly configured data storage systems, depicted as performance configurations (558), may be provided to the sizing module (412) for use in determining a response to a request for a storage system sizing solution.

Figure 5B:
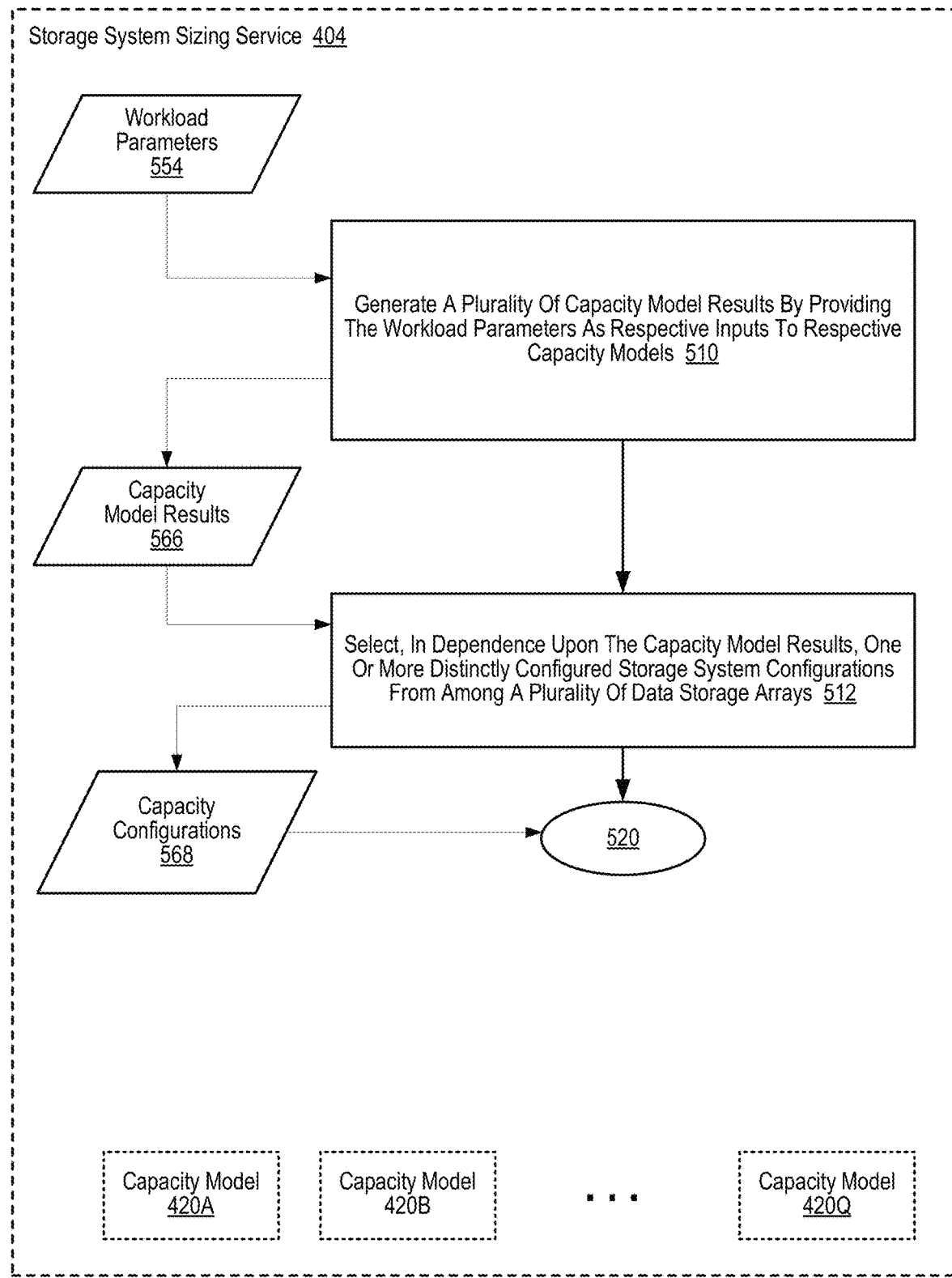
FIG. 5B sets forth a flow chart illustrating an additional example method of a storage system sizing service according to some embodiments of the present disclosure.

For further explanation, FIG. 5B sets forth a flow chart illustrating an example method of storage system sizing in a storage system sizing service (404) according to some embodiments of the present disclosure. Although depicted in less detail, the storage system sizing service (404) depicted in FIG. 5B may be similar to the systems described above with reference to FIG. 4. In other words, the storage system sizing service (404) depicted in FIG. 5B may include the same, fewer, or additional components as the storage system sizing service (404) described above.

The example method depicted in FIG. 5B includes generating (510) a plurality of capacity model results (566) by providing the workload parameters (554) as respective inputs to respective capacity models, where the respective capacity models correspond to respective distinct configurations of a plurality of data storage systems, and selecting (512), in dependence upon at least the capacity model results (566), one or more distinctly configured data storage systems, depicted as capacity configurations (568), from among the plurality of data storage systems.

In different examples, the functionality depicted within the flowchart of FIG. 5B, in addition to other functionality, may be distributed in different ways among the various components of the storage system sizing service (404).

Generating (510) the plurality of capacity model results (566) may be carried out by the storage system sizing service (404) using the workload parameters (554) to generate an input that corresponds to a particular one or more capacity models (420A-420Q). In this example, the output of the one or more capacity models (420A-420Q) operating on the workload parameters (554) is used to generate one or more capacity model results (566) that may be combined or used individually, depending on a particular combination of workload parameters. In other words, as described above with reference to FIG. 4, a capacity modeling service (420) may carry out generating (510) the plurality of capacity model results (566).

As one example, given workload parameters that include indications for a minimum storage capacity or some other storage capacity requirement, a data reduction ratio, a R/W ratio, and a read/write size, the storage system sizing service (404) may generate or use M modeling benchmarks, where $M=P_1 \times P_2 \times \ldots \times P_n$, and where $P_1$ may represent a number of variations for a data reduction ratio, $P_2$ may represent a number of variations for R/W ratios, and $P_n$ may represent a number of variations for read/write sizes. In this example, $P_1$ may be three (3), and include variations of 1:1, 5:1, 10:1; $P_2$ may be two (2), and include variations of 8 KB and 32 KB; and $P_n$ may be three (3) and include variations of 1:1, 2:1, 1:2. However, in other examples, there may be additional workload parameters and/or additional variations for each given workload parameter. In other words, the number of modeling benchmarks M may vary in direct correlation to the number n of workload parameters P and to the number of variations i for each workload parameter selected from among all possible parameter combinations, where n and i may be arbitrarily defined.

To continue with this example, given the 18 modeling benchmarks, the storage system sizing tool (404) may select one of the modeling benchmarks based on the workload parameters, and apply one or more adjustment factors corresponding to each applicable capacity model to generate capacity model results (566). For example, given a workload parameter specifying 50 TB of storage capacity, and a selection of storage services that include data reduction and a data reduction ratio of 5:1, and snapshots. Therefore, the capacity models corresponding to the workload parameters that affect storage capacity are a data reduction model and a snapshot model. Specifically, because data reduction incurs system overhead in terms of storage for implementing the data reduction, such as metadata, a data reduction factor for the data reduction model is applied to determine an adjustment to storage system storage capacity that may be provided due to implementing data reduction. In this example, starting with 10 TB of minimum storage for a storage system configuration due to the data reduction factor of 5:1, the data reduction factor may be 0.1, and in response to 10 TB being multiplied by the data reduction factor of 0.1, a storage resource cost of storage capacity overhead is determined to be 10 TB×0.1=1 TB. Consequently, in this example, for the data reduction model corresponding to a 5:1 data reduction ratio, after applying a corresponding data reduction factor to the workload capacity parameter corresponding to 10 TB, an adjusted storage capacity requirement, C, is 11 TB. In different examples, for different data reduction ratios, there may be different corresponding data reduction factors to account for different amounts of storage capacity overhead that may be incurred by corresponding levels of storage capacity resources used in reaching a given data reduction ratio.

Continuing with this example, given the input specifications (552) specified that snapshots will be taken periodically for the stored data, then the storage system sizing service (404) may determine a corresponding snapshot factor for the corresponding snapshot model for the corresponding modeling benchmark. For example, if a user specifies a snapshot frequency of $Z_1$ minutes, then the storage system sizing service (404) may determine a snapshot factor S to be $S_1$, and for a snapshot frequency of $Z_2$, the storage system sizing service (404) may determine a snapshot factor S to be $S_2$, where the snapshot factor S may increase as the snapshot frequency increases. In this way, the current storage capacity requirement of C=11 TB, with is the storage capacity requirement after application of the data reduction factor above, may be determined to be C=11 TB+(11 TB×S)=12 Tb, where the snapshot factor S is 0.1. In general, for other examples, based on the read/write ratios, adjustment factors for reads and writes, in accordance with expected IOPS, may be calculated according to respective factors based on a read operation being less storage capacity intensive than a write operation.

While in this example, for the sake of simplicity and not by way of limitation, only a single storage capacity measure is considered. However, in other examples, there may be other storage capacity parameters to which each applicable performance model may be applied. For example, instead of a volume size in terabytes as a whole, a storage capacity parameter may specifically indicate a cache size, cache levels, or generally any other storage capacity metric that may correspond to a storage system.

In this example, the capacity model results (566) may include a range of performance values $\{C_1 \ldots C_n\}$, for each specified storage capacity workload parameter, where in this example, given only storage capacity, the range of performance values is $\{(C_1=50 \text{ TB})\}$. Further, given storage system capacities for different storage system configurations, the storage system sizing service (404) may then base a determination of one or more storage systems that would meet or exceed each of the capacity values, where the determination is described as the selecting (506) step below.

Selecting (512), in dependence upon at least the capacity model results (566), one or more distinctly configured data storage systems, depicted as performance configurations (568), from a plurality of data storage systems may be carried out by determining that the capacity model results (566) correspond to one or more of the storage capacities of one or more or a combination of storage systems. For example, based a particular capacity model result, $C_i$, of the capacity model results (566), the storage system sizing service (404) may determine that a single storage system or a combination of storage systems of storage systems may provide storage capacity that satisfies a storage capacity specification after accounting for capacity overhead incurred in implementing all selected storage services.

Further, in some examples, given a capacity model value of $C_i$=50 TB, the storage system sizing service (404) may select a storage system or a combination of storage systems such that $C_i$ is no more than a threshold factor, T, of the storage capacity of one or more storage systems. In other words, rather than selecting a storage system with a maximum storage capacity, which would satisfy most capacity model values determined by the capacity model, the storage system sizing service may select a storage system that provides no more than the threshold factor of storage capacity over the capacity model value. In this particular example, T may be 0.1, or some other pre-defined threshold value, where the threshold value may be adjustable dynamically in response to an administrator, or in response to a machine learning algorithm determining that a different threshold factor (for example, based at least in part on performance metrics for similarly configured storage systems carrying similar workloads performing similarly with a different threshold value) would be more resource efficient or cost-effective. In this way, in this example, the storage system sizing service (404) may select a storage system that is configured with Z amount of storage capacity, where Z is greater than or equal to $C_i+(C_i \times T)$=12 TB+(12 TB×0.1)=14 TB (rounded), or a storage system configuration that provides between 12 TB and 14 TB. In a more general example, similar determinations may be made for each capacity model value $C_i$ among multiple capacity model results $\{C_1 \ldots C_n\}$, depicted as capacity model results (566).

In some examples, the available storage systems from which the storage system sizing service (404) selects the one or more storage systems may be based on product line offerings of one or more companies or vendors, combinations of product line offerings of multiple companies or vendors, customized storage system hardware, virtualized configurations for a storage system, or combinations of physical and virtual storage systems.

In this way, the selected one or more distinctly configured data storage systems, depicted as capacity configurations (568), may be provided to the sizing module (412) for use in determining a response to a request for a storage system sizing solution.

For further explanation, FIG. 5B sets forth a flow chart illustrating an example method of storage system sizing in a storage system sizing service (404) according to some embodiments of the present disclosure. Although depicted in less detail, the storage system sizing service (404) depicted in FIG. 5C may be similar to the systems described above with reference to FIGS. 4, 5A, and 5B. In other words, the storage system sizing service (404) depicted in FIG. 5C may include the same, fewer, or additional components as the storage system sizing service (404) described above.

Figure 5C:
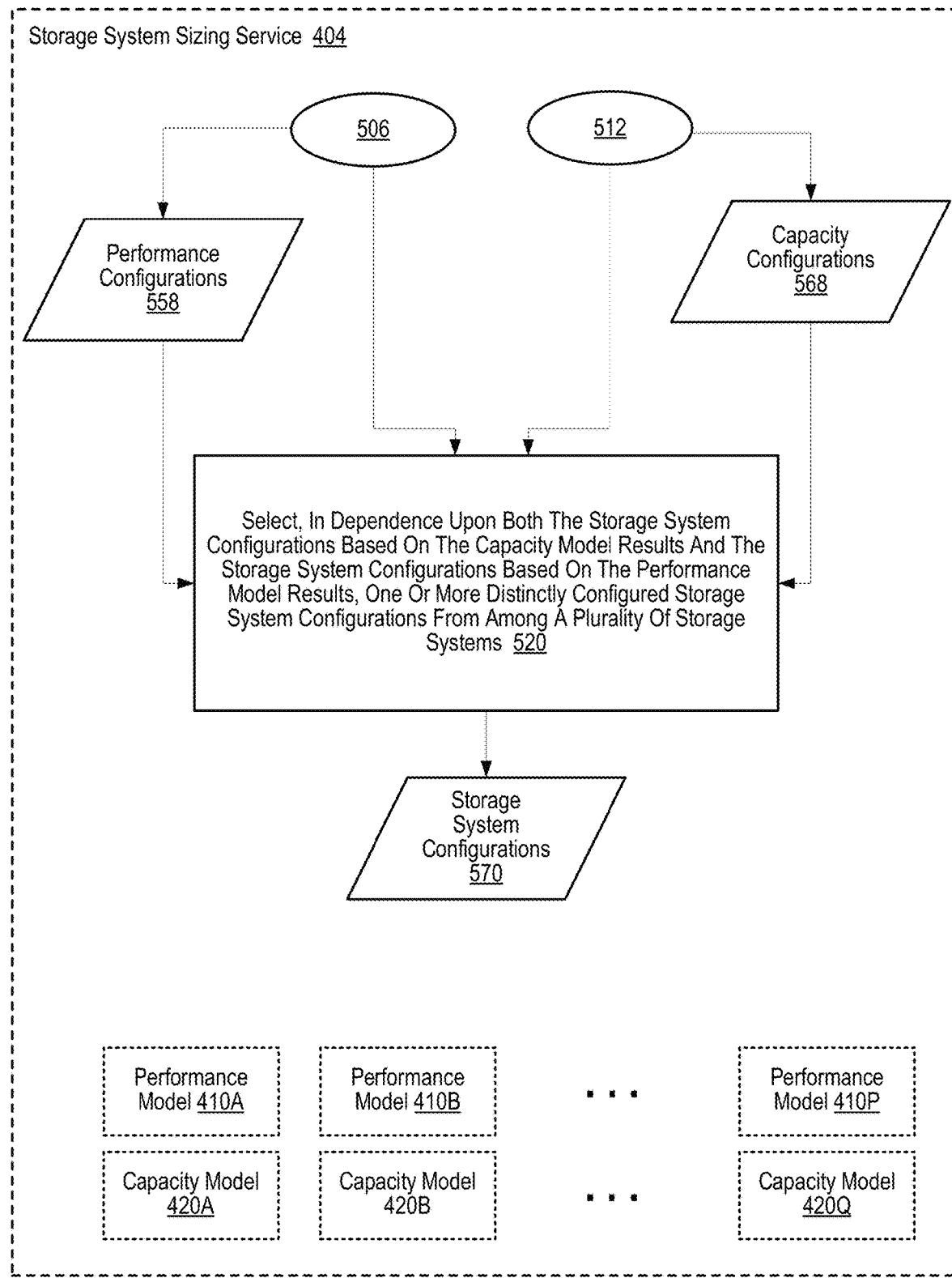
FIG. 5C sets forth a flow chart illustrating an additional example method of a storage system sizing service according to some embodiments of the present disclosure.

The example method depicted in FIG. 5C includes selecting (520), in dependence upon both the storage system configurations (568) based on the capacity model results and the storage system configurations (558) based on the performance model results, one or more distinctly configured storage system configurations from among a plurality of storage systems. Selecting (520), in dependence upon both the storage system configurations (568) based on the capacity model results and the storage system configurations (558) based on the performance model results, one or more distinctly configured storage system configurations from among a plurality of storage systems may be implemented as described above with regard to FIGS. 5A and 5B. Specifically, any storage system configuration that is in both the performance configurations (558) and also in the capacity configurations (568) necessarily, and logically satisfies both storage capacity specifications and performance specifications provides within specifications (552). In other words, results of an intersection of a set of storage systems corresponding to performance configurations (558) and a set of storage systems corresponding to capacity configurations (568) may be the result of the storage system sizing service provided by storage system configurations (570).

In this way, the storage system sizing service (404) may make a determination of a selection of one or more storage systems such that all specifications are satisfied with regard to at least storage capacity and performance.

For further explanation, FIG. 6 sets forth a flow chart illustrating an example method of storage system sizing in a storage system sizing service (404) according to some embodiments of the present disclosure. Although depicted in less detail, the storage system sizing service (404) depicted in FIG. 6 may be similar to the systems described above with reference to FIGS. 4 and 5A-5C. In other words, the storage system sizing service (404) depicted in FIG. 6 may include the same, fewer, or additional components as the storage system sizing service (404) described above.

The example method depicted in FIG. 6 is similar to the example method depicted in FIG. 5A in that the example method depicted in FIG. 6 includes: translating (502) one or more specifications characterizing user requirements into workload parameters (554), generating (504) a plurality of performance modeling results (556) by providing the workload parameters (554) as respective inputs to respective performance models, where the respective performance models correspond to respective distinct configurations of a plurality of data storage systems, and selecting (506), in dependence upon at least the performance model results (556), one or more distinctly configured data storage systems, depicted as performance configurations (558), from the plurality of data storage systems.

However, the example method depicted in FIG. 6 further specifies, with regard to generating (504) the plurality of performance modeling results (556) by providing the workload parameters (554) as respective inputs to respective performance models, that the respective performance models include one or more of a snapshot model (602A), an asynchronous replication model (602B), and a synchronous replication model (602N). As discussed above, this list of performance models is not exhaustive, and may include performance models for any aspect of storage system that may cause a reduction in performance as a result of implementing a given specification (552) or data storage service. Implementing each of these performance models may be performed as described above with regard to FIG. 5A.

For further explanation, FIG. 7 sets forth a flow chart illustrating an example method of storage system sizing in a storage system sizing service (404) according to some embodiments of the present disclosure. Although depicted in less detail, the storage system sizing service (404) depicted in FIG. 7 may be similar to the systems described above with reference to FIGS. 4 and 5A-5C. In other words, the storage system sizing service (404) depicted in FIG. 7 may include the same, fewer, or additional components as the storage system sizing service (404) described above.

The example method depicted in FIG. 7 is similar to the example method depicted in FIG. 5B in that the example method depicted in FIG. 7 includes: generating (510) a plurality of capacity model results (566) by providing the workload parameters (554) as respective inputs to respective capacity models, where the respective capacity models correspond to respective distinct configurations of a plurality of data storage systems, and selecting (512), in dependence upon at least the capacity model results (566), one or more distinctly configured data storage systems, depicted as capacity configurations (568), from among the plurality of data storage systems.

However, the example method depicted in FIG. 7 further specifies, with regard to generating (510) the plurality of capacity modeling results (566) by providing the workload parameters (554) as respective inputs to respective capacity models, that the respective capacity models include one or more of a snapshot model (702A), a replication model (702B), a growth model (702C), and a asynchronous replication model (702M). As discussed above, this list of capacity models is not exhaustive, and may include capacity models for any aspect of storage system that may cause a reduction in storage capacity as a result of implementing a given specification (552) or data storage service. Implementing each of these capacity models may be performed as described above with regard to FIG. 5B.

In another embodiment of a storage system sizing service (404), the storage system sizing service (404) may implement a method that includes: for each of a plurality of storage system configurations, determining multiple combinations of workload parameters, wherein the multiple combinations of workload parameters include, for one or more of the workload parameters, one or more values of a range of a workload parameter.

In this embodiment, determining, for each of a plurality of storage system configurations, multiple combinations of workload parameters, where the multiple combinations of workload parameters include, for one or more of the workload parameters, one or more values of a range of a workload parameter may be implemented by the storage system sizing service (404) accessing storage system configurations (652) and/or storage system specifications for each storage system available. Further, the storage system sizing service (404) may, for each storage system specification accessed, determine configuration options and storage system characteristics, where each storage system configuration may be associated with a model configuration profile that indicates ranges of workload parameters. In some examples, the model configuration profile may have metadata that indicates most likely configuration options as determined by metrics for deployed storage systems with a similar configuration and/or as determined by a pre-defined set of spectrums of workload parameter settings. For example, the pre-defined set of spectrums of workload parameters may indicate, for each workload parameter with a range of options, a subset of specific workload settings for which a model is to be calculated. As described above for workload parameters for data reduction ratios, read/write ratios, and I/O sizes, a model configuration profile may, for each of these parameters, include a list of likely, or useful, workload parameter settings. This example extends to additional or fewer workload parameters, and, for each workload parameter, to additional or fewer workload parameter settings as described above. Continuing with this example, the storage system sizing service (404) may then generate workload parameter combinations based on the workload parameters, and workload parameter ranges specified in the model configuration profile.

In another embodiment of a storage system sizing service (404), the storage system sizing service (404) may implement a method that includes, generating, based upon one or more scale factors corresponding to respective storage capacity implementation factors, a plurality of capacity models. In this example, one or more scale factors may be specified for each workload parameter that has an impact on storage capacity, where the one or more scale factors may be defined for a given capacity model.

In another embodiment, with reference to FIG. 5B, selecting (512), based upon the capacity model results, one or more storage system configurations (566) may be implemented by determining whether each capacity model result for the one or more storage system configurations (566)

satisfies a respective threshold capacity utilization value—where this determination may be implemented by the storage system sizing service (404) comparing, for each available storage system configuration, the capacity model result value for the corresponding model against a respective threshold value to determine whether or not the generated capacity utilization value is greater or less than the respective threshold capacity utilization value. For example, as described above, for a given storage system configuration, and corresponding model with a given selection of workload parameter settings, if the corresponding capacity model result value, $C_i$ is less than a threshold percentage of one or more storage system hardware specifications, then the given storage system may be selected. In some cases, for multiple storage systems that satisfy the threshold capacity value determination, one or more storage systems that are nearest to the threshold capacity value may be selected on the basis that such a storage system would be most cost effective by not having a disproportionate amount of resources than what is needed by a user to satisfy particular specifications and/or requirements. In other words, in some cases, the storage system sizing service (404) may select a storage system that minimally satisfies user specifications and/or requirements, which may correspond to a maximally cost-effective selection.

In this way, the storage system sizing service (404) may determine true or accurate storage system specifications that will meet requested requirements and/or specifications. For example, while a request may indicate a requirement for 50 TB, selecting a storage system with 50 TB may not account for, or satisfy, basic performance metrics for operation because such a selection would not take in to account the additional storage system resources needed for maintaining and providing the 50 TB of storage. In other examples, if a request is made for 50 TB, with no storage services, and with a data reduction rate of 5:1, then a selected storage system of, say, 15 TB may be determined to be sufficient for a user-which may be an advantage to a user expecting to pay for at least 50 TB of storage capacity.

In another embodiment, with regard to the capacity models discussed above with regard to FIGS. 5B and 7, the storage system sizing service (404) may determine, based upon the one or more growth models, an updated one or more storage system configurations (756) that satisfy a capacity specification and also satisfies a threshold obsolescence window.

For example, the storage system sizing service (404) may determine, based upon one or more storage system configurations (568) and upon the one or more storage system metrics (424), a growth model for a particular type of dataset or workload to be stored. For example, given a selection of one or more storage systems, as indicated by the storage system configurations (568), the storage system sizing service (404) may reference a respective growth rate for a storage system that is similarly configured supporting a similar workload type or types. In some cases, the growth rate may be provided by a reference file of growth rates that correspond to differently configured storage systems for given types of workloads. However, in other cases, the growth rate may be based upon a machine learning algorithm that trains on metrics (424) provided by a storage system monitor (444) or monitors or by a management app, such as a cloud-based management app that manages one or more storage systems, where the metrics indicate usage history for the type of workload. In this way, the storage system sizing service (404) may generate, for each storage system configuration within the storage system configurations (568) determined (510) above, a set of growth models that includes indications of growth rates corresponding to each storage system configuration and workload type or dataset type.

Continuing with this example, based upon the one or more growth models determined above, the storage system sizing service (404) may determine an updated one or more storage systems configurations (568) that satisfy all capacity requirements and, now, also a threshold obsolescence window may be implemented by the storage system sizing service (404) using the growth rate for each storage system configuration to determine at what point the storage system configuration exceeds a capacity utilization that results in performance metrics or capacity utilization values that are below a specified threshold for performance. For example, if a given storage system configuration, given a particular growth rate, will have a capacity utilization or performance degradation of a specified threshold for performance within a threshold obsolescence window of a particular period of time, for example Z weeks or months, then the storage system sizing service (404) may exclude that storage system configuration and select, from among all storage system configuration options (568) a storage system that will not have a capacity utilization or performance degradation until after the threshold obsolescence window. In this way, the storage system sizing service (404) selects storage system configurations that will meet specifications for a particular, or specified length of time.

Readers will appreciate that although the previous paragraphs relate to embodiments where steps may be described as occurring in a certain order, no ordering is required unless otherwise stated. In fact, steps described in the previous paragraphs may occur in any order. Furthermore, although one step may be described in one figure and another step may be described in another figure, embodiments of the present disclosure are not limited to such combinations, as any of the steps described above may be combined in particular embodiments.

Example embodiments are described largely in the context of a fully functional computer system. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present disclosure.

Embodiments can include a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to some embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Readers will appreciate that the steps described herein may be carried out in a variety of ways and that no particular ordering is required. It will be further understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method comprising:
receiving a request for one or more storage systems, the request comprising at least one storage capacity requirement, at least one performance requirement, and an identification of a data snapshot model including a snapshot frequency to be implemented by the one or more storage systems;
based on the request, calculating performance model results using the at least one storage capacity requirement, the at least one performance requirement, and the identification of the data snapshot model to be implemented by the one or more storage systems;
utilizing the performance model results to identify one or more distinctly configured storage system configurations to support the one or more storage systems, the one or more distinctly configured storage system configurations including a first storage system configuration that provides a maximum possible performance given the data snapshot model and a second storage system configuration that provides a threshold level of performance of the performance model results but is less than the maximum possible performance; and
providing, in response to the request, from the one or more identified storage system configurations, the second storage system configuration instead of the first storage system configuration.

2. The method of claim 1, further comprising:
generating a plurality of capacity model results by providing workload parameters as respective inputs to respective capacity models.

3. The method of claim 2, wherein the one or more distinctly configured storage system configurations are selected further in dependence upon the plurality of capacity model results.

4. The method of claim 1, wherein the request for one or more storage systems includes one or more of: one or more types of service to be provided by one or more storage systems, one or more indications of a level of service, an indication of a storage capacity requirement, an indication of a growth rate for storage usage, or one or more indications of financial restrictions.

5. The method of claim 1, wherein the one or more distinctly configured storage system configurations factor in system overhead that is unaccounted for in the request for one or more storage systems.

6. The method of claim 2, wherein the workload parameters include one or more configuration settings for one or more data storage systems.

7. The method of claim 2, further comprising generating the workload parameters from the request.

8. The method of claim 1, wherein one or more of the respective performance models are constructed based on one or more of: data storage system parameters corresponding to different types of customer services, or one or more threshold limits for one or more configuration settings for one or more data storage systems.

9. The method of claim 1, wherein the one or more distinctly configured storage system configurations comprise a single storage system selected from among a plurality of storage system configurations, and wherein the single storage system is configured based upon the performance model results and the request for one or more storage systems.

10. The method of claim 1, wherein the one or more distinctly configured storage system configurations comprise multiple storage systems from among a plurality of storage system configurations, and wherein the multiple storage systems are respectively configured based on the performance model results.

11. The method of claim 1, wherein the request for one or more storage systems is received via a service interface of a storage system sizing service implemented within a data center, and wherein the service interface provides an access point to one or more remote client devices for accessing a user interface.

12. The method of claim 11, wherein the service interface provides a plurality of access points to simultaneously, over a network, provide multiple user interfaces and receive multiple specifications characterizing user requirements from different ones of multiple clients accessing the plurality of access points.

13. A method comprising:
for each of a plurality of storage system configurations, determining multiple combinations of workload parameters for calculating a model of a storage system configuration, including, for one or more of the workload parameters, one or more values of a range of a given workload parameter, wherein the workload parameters represent capacity and performance requirements of each configuration of the storage system, and wherein the workload parameters account for a snapshot policy including a snapshot frequency to be implemented by the storage system;
generating, based upon one or more scale factors applied to each of the multiple combinations of workload parameters, a model predicting capacity utilization values and performance values for each of the plurality of storage system configurations;
determining, based upon the predicted capacity utilization values, the performance values, and a threshold obsolescence window, one or more storage system configurations that satisfy, during the threshold obsolescence window, a threshold capacity utilization value and a threshold performance value, wherein the threshold obsolescence window is a time period during which a storage system configuration maintains a threshold performance, wherein the one or more storage system configurations include a first storage system configuration that provides a maximum possible performance given the snapshot policy and a second storage system configuration that provides a threshold level of performance of the performance model results but is less than the maximum possible performance; and
selecting, from the one or more storage system configurations, the second storage system configuration instead of the first storage system configuration.

14. The method of claim 13, wherein each scale factor, when applied to a minimum storage capacity specification generates a storage capacity value representing storage or processing resources used by a storage system in storing and managing the minimum storage capacity.

15. The method of claim 13, wherein each scale factor corresponds to respective storage system management operations.

16. The method of claim 15, wherein the respective storage system management operations include managing snapshots, managing data replication, data reduction, reading data, writing data, erasing data, or I/O operations.

17. The method of claim 13, wherein the one or more values of the range of the given workload parameter include one or more most likely configuration settings for the given workload parameter.

18. The method of claim 13, wherein the threshold capacity utilization value is a minimum value that enables the one or more storage system configurations to satisfy one or more of a financial metric, a performance metric, a storage capacity metric, or a level of service metric.

19. The method of claim 13, wherein the method further comprises:
- determining, based upon the one or more storage system configurations and upon one or more storage system metrics, a growth model for each of the one or more storage system configurations; and
- determining, based upon the growth models, an updated one or more storage system configurations that satisfy a threshold capacity value during the threshold obsolescence window.

20. A computer program product disposed on a non-transitory computer readable medium, the computer program product including computer program instructions that, when executed, carry out the steps of:
- for each of a plurality of storage system configurations, determining multiple combinations of workload parameters for calculating a model of a storage system configuration, including, for one or more of the workload parameters, one or more values of a range of a given workload parameter, wherein the workload parameters represent capacity and performance requirements of each configuration of the storage system, and wherein the workload parameters account for a snapshot policy including a snapshot frequency to be implemented by the storage system;
- generating, based upon one or more scale factors applied to each of the multiple combinations of workload parameters, a model predicting capacity utilization values and performance values for each of the plurality of storage system configurations;
- determining, based upon the predicted capacity utilization values, the performance values, and a threshold obsolescence window, one or more storage system configurations that satisfy, during the threshold obsolescence window, a threshold capacity utilization value and a threshold performance value, wherein the threshold obsolescence window is a time period during which a storage system configuration maintains a threshold performance, wherein the one or more storage system configurations include a first storage system configuration that provides a maximum possible performance given the snapshot policy and a second storage system configuration that provides a threshold level of performance of the performance model results but is less than the maximum possible performance; and
- selecting, from the one or more storage system configurations, the second storage system configuration instead of the first storage system configuration.

* * * * *